United States Patent
Yoshida et al.

(10) Patent No.: US 6,563,172 B2
(45) Date of Patent: May 13, 2003

(54) SEMICONDUCTOR SUBSTRATE PROCESSING METHOD

(75) Inventors: Yoshiko Yoshida, Tokyo (JP); Hideki Naruoka, Tokyo (JP); Yasuhiro Kimura, Tokyo (JP); Yasuo Yamaguchi, Tokyo (JP); Toshiaki Iwamatsu, Tokyo (JP); Yuuichi Hirano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/770,388

(22) Filed: Jan. 29, 2001

(65) Prior Publication Data

US 2001/0012649 A1 Aug. 9, 2001

Related U.S. Application Data

(62) Division of application No. 09/113,155, filed on Jul. 10, 1998, now Pat. No. 6,232,201.

(30) Foreign Application Priority Data

Jan. 13, 1998 (JP) ................................................ 10-4980

(51) Int. Cl.[7] .......................... H01L 27/01; H01L 27/12; H01L 31/0392
(52) U.S. Cl. .................... 257/347; 257/506; 257/638
(58) Field of Search ................................. 257/347, 506, 257/638; 438/978, FOR 458; 148/33.3

(56) References Cited

U.S. PATENT DOCUMENTS

| 5,233,218 A | * | 8/1993 | Miura ........................ 257/347 |
| 5,258,323 A | | 11/1993 | Sarma et al. |
| 5,340,435 A | * | 8/1994 | Ito et al. .............. 148/DIG. 12 |
| 5,494,849 A | | 2/1996 | Iyer et al. |
| 5,719,426 A | * | 2/1998 | Iwamatsu et al. ........... 257/347 |
| 5,973,365 A | * | 10/1999 | Deleonibus ................. 257/347 |
| 5,982,003 A | * | 11/1999 | Hu et al. ..................... 257/347 |
| 6,118,152 A | * | 9/2000 | Yamaguchi et al. ........ 257/347 |
| 6,294,478 B1 | * | 9/2001 | Sakaguchi et al. ......... 148/33.2 |

FOREIGN PATENT DOCUMENTS

| EP | 756319 A2 | * | 1/1997 | ......... H01L/21/762 |
| JP | 4-129267 | | 4/1992 | |
| JP | 8-195483 | | 7/1996 | |
| JP | 11067701 A | * | 3/1999 | ........... H01L/21/02 |
| JP | 11111581 A | * | 4/1999 | ........... H01L/21/02 |

* cited by examiner

*Primary Examiner*—Olik Chaudhuri
*Assistant Examiner*—Michelle Estrada
(74) *Attorney, Agent, or Firm*—Oblon, Spivak, McClelland, Maier & Neustadt, P.C.

(57) ABSTRACT

An object is to provide a semiconductor substrate processing method and a semiconductor substrate that prevent formation of particles from the edge part of the substrate. Silicon ions are implanted into the edge part of an SOI substrate (10) in the direction of radiuses of the SOI substrate (10) to bring a buried oxide film (2) in the edge part of the SOI substrate (10) into a silicon-rich state. Thus an SOI substrate (100) is provided, where the buried oxide film (2) has substantially been eliminated in the edge part.

5 Claims, 20 Drawing Sheets

SEMICONDUCTOR SUBSTRATE PROCESSING METHOD

This is a division of application Ser. No. 09/113,155, filed, Jul. 10, 1998, now U.S. Pat. No. 6,232,201.

BACKGROUND OF THE INVENTION

1. Field of the Invention

The present invention relates to methods for processing semiconductor substrates and the semiconductor substrates, and particularly to a semiconductor substrate processing method and a semiconductor substrate in which formation of dust particles from the edge part of the substrate is prevented.

2. Description of the Background Art

While SOI (Silicon On Insulator) devices in which semiconductor elements are formed on SOI substrates are superior to bulk devices in their reduced junction capacitance and improved element isolation breakdown voltage, the SOI devices have their unique problems as described below.

FIG. 32 shows a partial cross-section of an SOI substrate 10. The SOI substrate 10 includes a buried oxide film 2 and a single-crystal silicon layer (hereinafter referred to as an SOI layer) 1 sequentially stacked in the upper main surface of a single-crystal silicon substrate 3.

SOI substrate manufacturing methods include an SIMOX (Separation by Implanted Oxygen) method and a bonding method, for example. The SOI substrate 10 shown in FIG. 32 is manufactured by the SIMOX method.

In the SIMOX method, an SOI structure is obtained by implanting oxygen ions into a single-crystal silicon substrate to doses of $1 \times 10^{18}$ to $2 \times 10^{18}/\text{cm}^2$ at 150 to 200 KeV and then annealing it at about 1300 to 1400° C., for example.

FIG. 32 shows the edge part of the SOI substrate 10 in detail. In the following description, a semiconductor substrate is referred to separately in its upper main surface (the side on which semiconductor elements are formed), center part thereof (the part including the active region), edge part including the peripheral part around the center part and the side part, and lower main surface.

As shown in FIG. 32, the edge part is curved with a large curvature. Accordingly, when oxygen ions are implanted there from the vertical direction, the oxygen ions are obliquely implanted, so that the effective implantation energy is reduced. As a result, the buried oxide film 2 and the SOI layer 1 are thinner in the edge part. Further, the surface of the edge part is not smooth but rough with irregularities. This phenomenon is general with silicon substrates formed by CZ (Czochralski) method. In the irregular part, the SOI layer 1 may be so thin that the buried oxide film 2 is exposed. In this condition, the SOI layer 1 is prone to exfoliation.

In addition, the film-thinning process for the SOI layer 1 performed in the SOI device manufacturing process facilitates the exfoliation of the SOI layer 1. The film-thinning process for the SOI layer 1 will now be described.

The SOI layer 1 in the SOI substrate 10 is formed to an approximate thickness at the time of production of the substrate. The film-thinning process for the SOI layer 1 is performed to appropriately reduce the thickness of the SOI layer 1 according to specifications of desired semiconductor devices. In this process, the thickness of the SOI layer 1 is adjusted by oxidizing the SOI layer 1.

The thickness of an oxide film formed on the SOI layer is generally determined on the basis of the thickness of the SOI layer 1 in the center part of the SOI substrate 10, or in the semiconductor element formation region (active region). In this process, the thin SOI layer 1 in the edge part of the SOI substrate 10 presents the problem as stated above. The buried oxide film 2 may be exposed in some parts.

FIG. 33 is a schematic diagram showing the region X in FIG. 32. As shown in FIG. 33, the buried oxide film 2 is also irregular in the edge part of the SOI substrate 10, reflecting the shape of the irregular part DP of the SOI layer 1. Since oxygen ions are implanted from the vertical direction, the irregularities on the SOI layer 1 and the irregularities on the buried oxide film 2 are formed in shifted positions, which may cause the buried oxide film 2 to be exposed.

Next, FIG. 34 shows the SOI layer 1 and an oxide film OX formed thereon to thin the SOI layer 1. As the formation of the oxide film OX thins the SOI layer 1, the oxide film OX may be coupled to the buried oxide film 2 or the SOI layer 1 may be completely oxidized in the edge part. In such a case, the SOI layer 1 may be partially surrounded by the buried oxide film 2 and the oxide film OX. For example, the part 1A of the SOI layer shown in FIG. 34 is surrounded by the oxide film OX and the buried oxide film 2.

When the SOI substrate 10 is wet-etched in this condition with an etching solution, such as hydrofluoric acid (HF), to remove the oxide film OX, the buried oxide film 2 will be etched away together with the oxide film OX, as shown in FIG. 35. Then, the SOI layer 1A will be lifted off to be a particle, which will be suspended in the etching solution and may adhere to the center part of the SOI substrate 10. If particles adhere to the semiconductor element formation region, it will cause defective formation of semiconductor elements to reduce the production yield.

In some cases, a polysilicon layer may be formed on the edge part and the lower main surface of the silicon substrate 3 for gettering of contaminants like heavy metals taken in the wafer manufacturing process or in the wafer process for transistors. In this case, the SOI layer 1 and the buried oxide layer 2 become uneven due to polycrystallinity of the polysilicon layer, and the SOI layer 1 will then partially come off to be particles, similarly to the phenomenon described above.

Particles may be produced also with SOI substrates formed by a bonding method (bonded substrates).

With a bonded substrate, the SOI structure is obtained by forming an oxide film on the upper main surface (on the main surface on which semiconductor elements are formed) of a silicon substrate 3, bonding another silicon substrate thereon, and polishing that silicon substrate to a desired thickness. FIG. 36 shows a cross-section of the edge part of an SOI substrate 20 formed this way.

In FIG. 36, an on-substrate oxide film 6 and a silicon layer 7 are placed on top of the other on the upper main surface of the silicon substrate 3 to form an SOI structure. The on-substrate oxide film 6 corresponds to the buried oxide film and the silicon layer 7 to the SOI layer.

With the SOI substrate 20 having this structure, the on-substrate oxide film 6 is exposed in the edge part. Hence, etching solution used in wet-etching may invade the exposed part to partially remove the on-substrate oxide film 6, causing the silicon layer 7 to be partially hung as shown in FIG. 37. In this condition, the silicon layer 7 is prone to come off to be a particle.

When the edge part of the on-substrate oxide film 6 and the silicon layer 7 is imperfectly beveled, the periphery will show continuous irregularities in a plane view. The irregular part may come off in transportation of the substrate to produce particles.

As described above, conventional semiconductor substrates, particularly SOI substrates produced by the SIMOX method have the problem that the SOI layers in the edge part of the substrates may come off to be particles, to reduce the production yield. Particles may be produced also with SOI substrates manufactured by the bonding method.

SUMMARY OF THE INVENTION

A first aspect of the present invention is directed to a method for processing a semiconductor substrate having a first main surface, a second main surface on the opposite side, and a side part, wherein a part where an active region is formed in the first main surface is defined as a center part, and a part including a peripheral region around the center part in the first main surface and the side part is defined as an edge part. According to the present invention, the semiconductor substrate is an SOI substrate formed by an SIMOX method, and the semiconductor substrate comprises a buried oxide film and an SOI layer formed in the first main surface in a sequentially stacked form, the method comprising a silicon-ion implantation step wherein silicon ions are implanted into the edge part to eliminate the buried oxide film formed in the edge part.

Preferably, according to a second aspect of the present invention, in the semiconductor substrate processing method, the silicon ion implantation step comprises the step of implanting the silicon ions from the side of the edge part in a direction of a radius of the SOI substrate.

Preferably, according to a third aspect of the present invention, in the semiconductor substrate processing method, the silicon ion implantation step comprises the step of forming an implant mask in the center part of the first main surface and then implanting the silicon ions from the side of the edge part and from the side of the first main surface of the SOI substrate.

A fourth aspect of the present invention is directed to a method for processing a semiconductor substrate having a first main surface, a second main surface on the opposite side, and a side part, wherein a part where an active region is formed in the first main surface is defined as a center part, and a part including a peripheral region around the center part in the first main surface and the side part is defined as an edge part. According to the fourth aspect, the semiconductor substrate processing method comprises the steps of (a) forming an insulating film to cover the edge part of the semiconductor substrate, (b) implanting oxygen ions from the side of the first main surface of the semiconductor substrate comprising the insulating film to form a buried oxide film and an SOI layer in a sequentially stacked form in the first main surface by an SIMOX method, and (c) removing the insulating film, thereby forming an SOI substrate having the buried oxide film extending in parallel with the main surface to the outermost end of the edge part.

Preferably, according to a fifth aspect of the present invention, in the semiconductor substrate processing method, the insulating film is formed to a thickness, in its thickest part, equal to or larger than a total thickness of the buried oxide film and the SOI layer, and the step (a) comprises the step of forming a thermal oxide film by a thermal oxidation method as the insulating film.

Preferably, according to a sixth aspect of the present invention, in the semiconductor substrate processing method, the insulating film is formed to a thickness, in its thickest part, equal to or larger than a total thickness of the buried oxide film and the SOI layer, and the step (a) comprises the step of forming a TEOS film by a low pressure CVD method as the insulating film.

A seventh aspect of the present invention is directed to a method for processing a semiconductor substrate having a first main surface, a second main surface on the opposite side, and a side part, wherein a part where an active region is formed in the first main surface is defined as a center part, and a part including a peripheral region around the center part in the first main surface and the side part is defined as an edge part. According to the seventh aspect of the present invention, the semiconductor substrate processing method comprises the steps of (a) applying a first oxygen-ion implantation from the side of the first main surface of the semiconductor substrate all over the surface, (b) selectively applying a second oxygen-ion implantation into the edge part from the side of the first main surface of the semiconductor substrate, and (c) applying an annealing processing to diffuse the oxygen ions implanted by the first and second oxygen-ion implantations to form a buried oxide film and a protective oxide film respectively in the center part and in the edge part and also to form an SOI layer on the buried oxide film, wherein the second oxygen-ion implantation has its implant peak set at a shallower position than that in the first oxygen-ion implantation, and the protective oxide film is formed in the edge part on at least the side of the first main surface from the surface to the inside.

Preferably, according to an eighth aspect of the present invention, in the semiconductor substrate processing method, the step (c) comprises the steps of applying a first annealing processing prior to the step (b) to form the buried oxide film and the SOI layer, and applying a second annealing processing after the step (b) to form the protective oxide film.

According to a ninth aspect of the present invention, a semiconductor substrate processing method comprises the steps of: (a) forming by a bonding method a stacked structure comprising a first semiconductor substrate, an on-substrate oxide film, and a second semiconductor substrate having an outside dimension larger than that of the on-substrate oxide film, the on-substrate oxide film and the second semiconductor substrate being sequentially stacked on a main surface of the first semiconductor substrate, (b) pressing down the second semiconductor substrate from above to bring a main surface of the second semiconductor substrate protruding over the main surface of the first semiconductor substrate into contact with the main surface of the first semiconductor substrate and bonding the first and second semiconductor substrates by a bonding method; and (c) polishing the second semiconductor substrate to a predetermined thickness to form an SOI layer.

A tenth aspect of the present invention is directed to a semiconductor substrate having a first main surface, a second main surface oil the opposite side, and a side part, wherein a part where an active region is formed in the first main surface is defined as a center part, and a part including a peripheral region around the center part in the first main surface and the side part is defined as an edge part. According to the tenth aspect, the semiconductor substrate comprises: a buried oxide film and an SOI layer formed in the first main surface in a sequentially stacked form; a doped polysilicon layer formed in the edge part to cover the edge part; and a protective oxide film formed in said doped polysilicon layer on at least the side of the first main surface from the surface to the inside.

Preferably, according to an eleventh aspect of the present invention, in the semiconductor substrate, a thickness of the doped polysilicon layer in its thickest part in the edge part is equal to or larger than a total thickness of the buried oxide film and the SOI layer, and the doped polysilicon layer is formed also on the second main surface.

The present invention includes a method for processing a semiconductor substrate having one main surface, the other main surface on the opposite side, and a side part, wherein a part where an active region is formed in the one main surface is defined as a center part, and a part including a peripheral region around the center part in the one main surface and the side part is defined as an edge part, the semiconductor substrate processing method comprising the steps of: (a) forming a doped polysilicon layer to cover the edge part of the semiconductor substrate; and (b) implanting oxygen ions from the side of the one main surface of the semiconductor substrate having the doped polysilicon layer to form a buried oxide film and an SOI layer in a sequentially stacked form in the one main surface by an SIMOX method and also to form a protective oxide film in the doped polysilicon layer on at least the side of the one main surface from the surface to the inside.

The present invention is directed to the semiconductor substrate processing method, wherein the doped polysilicon layer is formed to a thickness, in its thickest part in the edge part, equal to or larger than a total thickness of the buried oxide film and the SOI layer, and wherein the step (a) comprises the step of forming the doped polysilicon layer also on the other main surface of the semiconductor substrate.

The present invention includes a method for processing a semiconductor substrate having one main surface, the other main surface on the opposite side, and a side part, wherein a part where an active region is formed in the one main surface is defined as a center part, and a part including a peripheral region around the center part in the one main surface and the side part is defined as an edge part, wherein the semiconductor substrate is an SOI substrate formed by an SIMOX method, and the semiconductor substrate comprises a buried oxide film and an SOI layer sequentially stacked in the one main surface, and wherein a laser beam is applied to the edge part from above in a vacuum to mix the SOI layer and the buried oxide film to form a molten layer in the edge part on the side of the one main surface at least.

The present invention includes a method for processing a semiconductor substrate having an on-substrate oxide film and an SOI layer sequentially stacked on one main surface of the semiconductor substrate, comprising the step of applying a laser beam from above to an edge part of the on-substrate oxide film and the SOI layer in a vacuum to mix the SOI layer and the on-substrate oxide film to form a molten layer in the edge part.

The present invention includes a semiconductor substrate having one main surface, the other main surface on the opposite side, and a side part, wherein a part where an active region is formed in the one main surface is defined as a center part, and a part including a peripheral region around the center part in the one main surface and the side part is defined as an edge part, the semiconductor substrate comprising, a buried oxide film and an SOI layer formed in the one main surface in a sequentially stacked form, and a protective oxide film formed in the edge part on at least the side of the one main surface from the surface to the inside.

The present invention includes semiconductor substrate having one main surface, the other main surface on the opposite side, and a side part, wherein a part where an active region is formed in the one main surface is defined as a center part, and a part including a peripheral region around the center part in the one main surface and the side part is defined as an edge part, the semiconductor substrate comprising, a buried oxide film and an SOI layer formed in the one main surface in a sequentially stacked form, and a molten layer formed by mixing the SOI layer and the buried oxide film in the edge part on the side of the one main surface at least.

The present invention includes a semiconductor substrate comprising an on-substrate oxide film and an SOI layer sequentially stacked on one main surface of the semiconductor substrate, which comprises a molten layer formed by mixing the SOI layer and the on-substrate oxide film in at least an edge part of the on-substrate oxide film and the SOI layer to cover the edge part.

The present invention includes a semiconductor substrate comprising an on-substrate oxide film and an SOI layer sequentially stacked on one main surface of the semiconductor substrate, which comprises an epitaxial layer formed on at least an edge part of the on-substrate oxide film and the SOI layer to cover the edge part.

According to the semiconductor substrate processing method of the first aspect of the present invention, the buried oxide film disappears in the edge part. In the process of thinning the SOI layer, for example, this prevents the problem that the SOI layer in the edge part is partially surrounded by the buried oxide film and an oxide film formed for the thinning process, partially lifted off in removal of the oxide film to be particles, and suspended in etching solution. This prevents defective formation of semiconductor elements due to the presence of particles, leading to improved production yield.

According to the semiconductor substrate processing method of the second aspect of the present invention, it is possible to eliminate the buried oxide film formed in the edge part only by an ion implantation from a single direction. This method is efficient and suppresses an increase in production cost due to the application of the invention.

According to the semiconductor substrate processing method of the third aspect of the present invention, it is possible to eliminate the buried oxide film not only in the edge part but also in a desired region in the center part. This allows the buried oxide film to be absent in a large region.

According to the semiconductor substrate processing method of the fourth aspect of the present invention, the buried oxide film extends to the outermost end of the edge in parallel with the main surface. Hence, a thin SOI layer is not formed on the buried oxide film in the edge part. In the process of thinning the SOI layer, for example, this prevents the problem that a thin SOI layer 1 is partially surrounded by the buried oxide film and an oxide film formed for the thinning process, partially lifted off in removal of the oxide film to be particles, and suspended in etching solution. This prevents defective formation of semiconductor elements due to the presence of particles, leading to improved production yield.

According to the semiconductor substrate processing method of the fifth aspect of the present invention, the thickness of the thickest part of the insulating film is set to be equal to or larger than the total thickness of the buried oxide film and the SOI layer so that the curved part of the buried oxide film is formed inside the insulating film. This prevents formation of the curved part of the buried oxide film in the edge part of the semiconductor substrate. Further, since the insulating film is formed as a thermal oxide film, it can easily be obtained with a suppressed increase in production cost due to the application of the invention.

According to the semiconductor substrate processing method of the sixth aspect of the present invention, the thickness of the thickest part of the insulating film is set to be equal to or larger than the total thickness of the, buried oxide film and the SOI layer so that the curved part of the buried oxide film is formed inside the insulating film. This prevents formation of the curved part of the buried oxide film in the edge part of the semiconductor substrate. Further, the insulating film is formed as a TEOS film, a good insulating film having less pinholes.

According to the semiconductor substrate processing method of seventh aspect of the present invention, a protective oxide film is formed in the edge part on, at least, the first main surface side from the surface to the inside. This prevents formation of a thin SOI layer on the buried oxide film in the edge part. In the process of thinning the SOI layer, for example, this prevents the problem that a thin SOI layer is partially surrounded by the buried oxide film and an oxide film formed for the thinning process, partially lifted off in removal of the oxide film to be particles, and suspended in etching solution. This in turn prevents defective formation of semiconductor elements due to the presence of particles, leading to improved production yield. Further, the protective oxide film is formed by using an ion implantation method and grown by annealing, as well as the buried oxide film. Therefore no extra devices nor extra process steps are required for the formation of the protective oxide film, suppressing an increase in production cost due to the application of the present invention.

According to the semiconductor substrate processing method of the eighth aspect of the present invention, the formation of the buried oxide film and the formation of the protective oxide film are accomplished by separate annealing processes, which provides good controllability for thickness of the individual oxide films.

The semiconductor substrate processing method of the ninth aspect of the present invention provides a semiconductor substrate formed by a bonding method, which has an on-substrate oxide film covered by an SOI layer. In wet etching for thinning the SOI layer, for example, this prevents the problem that the on-substrate oxide film is partially removed and the SOI layer thereon is put in a partially hanging state, thereby preventing exfoliation of the SOI layer and hence formation of particles.

According to the semiconductor substrate of the tenth aspect of the present invention, the doped polysilicon layer is composed of a protective oxide film in the edge part on the first main surface side at least, so that a thin SOI layer is not formed on the buried oxide film in the edge part. In the process of thinning the SOI layer, for example, this prevents the problem that a thin SOI layer is partially surrounded by the buried oxide film and an oxide film formed for the thinning process, partially lifted off in removal of the oxide film to be particles, and suspended in etching solution.

The semiconductor substrate of the eleventh aspect of the present invention provides a specific structure for forming the doped polyisilicon layer with a protective oxide film in the edge part on the first main surface side at least. Further, the doped polysilicon layer is formed also on the second main surface, which can be used as a gettering layer.

The present invention has been made to solve the problems described above, and an object of the present invention is to provide a semiconductor substrate processing method and a semiconductor substrate that can prevent formation of particles from the edge part of the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

A semiconductor substrate processing method and a semiconductor substrate according to a first preferred embodiment of the present invention will now be described referring to FIG. 1 to FIG. 4. In the following description, a semiconductor substrate is referred to separately in its upper main surface (the side on which semiconductor elements are formed), center part thereof (including the active region in which semiconductor elements are actually formed), edge part including the peripheral part around the center part and the side, and lower main surface.

A-1. Processing Method

Figure 1:
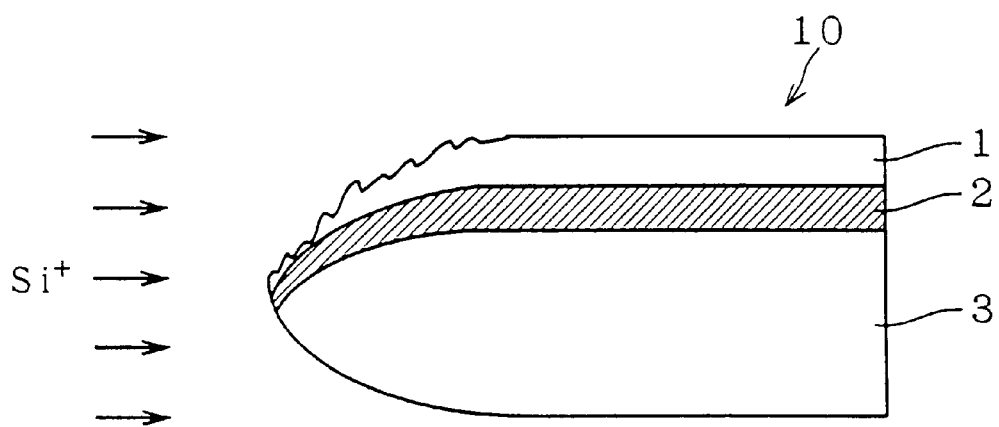
FIG. 1 is a cross-sectional view used to describe a semiconductor substrate processing process according to a first preferred embodiment of the present invention.

FIG. 1 is a diagram showing a partial section of an SOI substrate 10 formed by an SIMOX (Separation by Implanted Oxygen) method. In the SIMOX method, an SOI structure is obtained by implanting oxygen ions to doses of $1 \times 10^{18}$ to $2 \times 10^{18}/cm^2$ at 150 to 200 KeV and then annealing it at about 1300 to 1400° C. The SOI substrate 10 includes a buried oxide film 2 and a single-crystal silicon layer (hereinafter referred to as an SOI layer) 1 sequentially stacked in the upper main surface of a single-crystal silicon substrate 3. The thickness of the buried oxide film 2 is about 0.05 to 0.5 $\mu$m, and the thickness of the SOI layer 1 is about 0.05 to 0.3 $\mu$m.

As shown in FIG. 1, the edge part forms a curved surface with large curvature. Accordingly, when oxygen ions are implanted from the vertical direction into the main surface to form the buried oxide film 2, the oxygen ions are obliquely implanted into the edge part, so that the effective implantation energy is reduced. As a result, the buried oxide film 2 and the SOI layer 1 are thinner in the edge part. The surface of the edge part is not smooth but rough with irregularities.

Silicon (Si) ions are implanted into the edge part of the SOI substrate 10. The silicon ions are implanted in the direction of radiuses of the SOI substrate 10 under the conditions of doses of $1 \times 10^{15}$ to $5 \times 10^{15}/cm^2$ and energies of 300 to 400 KeV, to a depth of about 1 $\mu$m from the substrate surface.

When silicon ions are to be implanted only into the edge part, implant mask may be formed on the upper and lower main surfaces of the SOI substrate 10. In ion implantation, implanting ions with the SOI substrate 10 rotated around the center allows the ions to be implanted into the entirety of the periphery of the SOI substrate 10.

Figure 2:
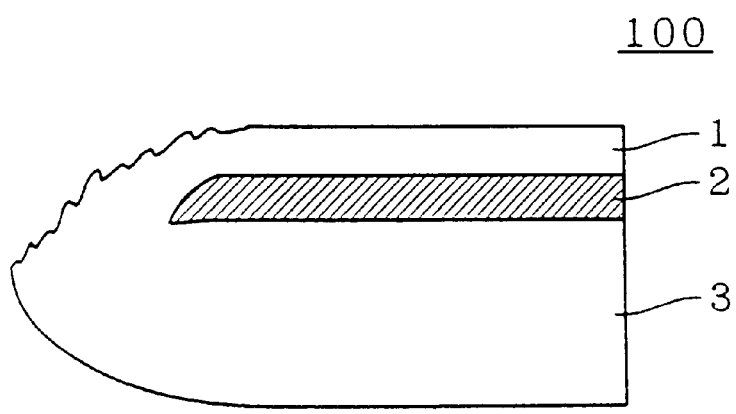
FIG. 2 is a cross-sectional view used to describe the structure of the semiconductor substrate according to the first preferred embodiment of the present invention.

As a result, the buried oxide film 2 in the edge part of the SOI substrate 10 becomes rich with silicon, and then the buried oxide film 2 substantially disappears in the SOI substrate 100, as shown in FIG. 2.

The buried oxide film 2 is eliminated in the region about 1 $\mu$m deep from the edge surface of the SOI substrate 10, resulting in the absence of the buried oxide film 2 exposed from the SOI substrate 10.

A-2. Characteristic Functions and Effects

The above-described first preferred embodiment of the present invention solves the problem that in a process of thinning the SOI layer 1, for example, the SOI layer 1 in the edge part is partially surrounded by the buried oxide film 2 and an oxide film formed for the thinning process, partially lifted off in removal of that oxide film to be particles, and suspended in the etching solution. This prevents defective formation of semiconductor elements due to the presence of particles, leading to improved yield in manufacturing.

Needless to say, this preferred embodiment is also effective with a structure in which a polysilicon layer is formed on the edge part and the lower main surface of the silicon substrate 3 for gettering of contaminants such as heavy metals.

A-3. First Modification

Although the description above has shown an example in which an ion implantation is applied to a single piece of SOI substrate 10. a plurality of SOI substrates 10 may be stacked and processed in a single ion implantation process.

Figure 3:
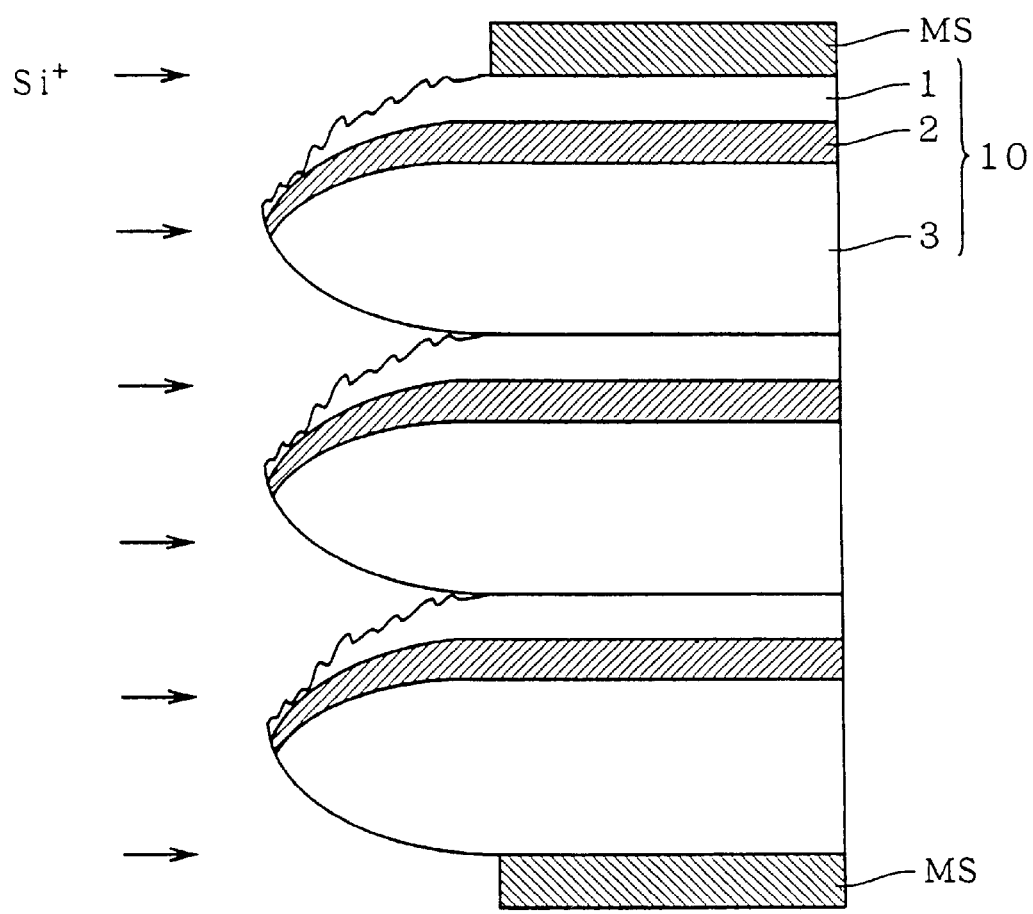
FIG. 3 is a cross-sectional view used to describe the semiconductor substrate processing process according to the first preferred embodiment of the present invention.

That is to say, as shown in FIG. 3, a plurality of SOI substrates 10 are sequentially laid on top of each other and silicon ions are implanted from the edge side with implant masks MS formed in the center parts of the main surfaces of the SOI substrates 10 on the top and bottom.

This method improves manufacturing efficiency of the SOI substrates 100. Further, this method does not require the formation of implant mask MS on the SOI substrates 10 other than the top and bottom SOI substrates 10, thus reducing the production cost.

Moreover, an ion beam generally has a dimension much larger than the thickness of the SOI substrate 10. Accordingly, applying the ion beam to a plurality of SOI substrates 10 is more efficient than applying it to a single piece of SOI substrate 10.

A-4. Second Modification

Although the description above has shown an example in which an ion beam is implanted from the direction of the radiuses of the SOI substrate 10, it may be implanted not only from the radial direction but also from the direction of the upper main surface.

Figure 4:
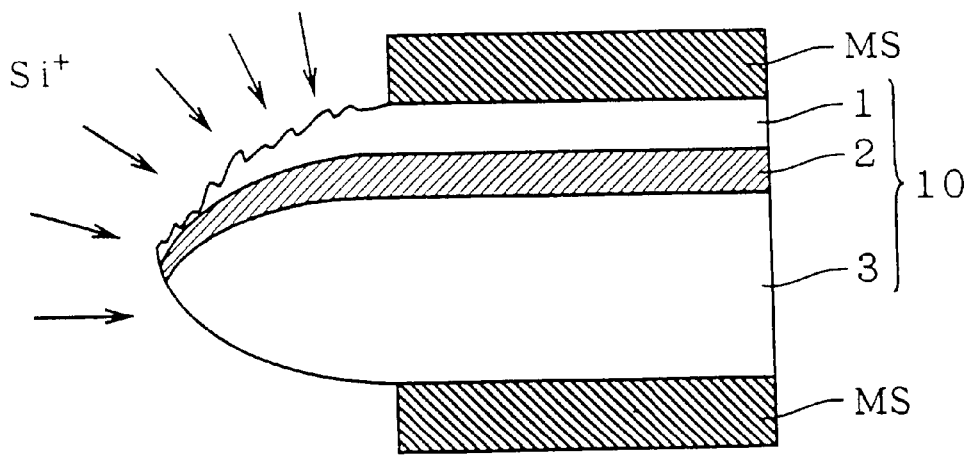
FIG. 4 is a cross-sectional view used to describe a modification of the semiconductor substrate processing process according to the first preferred embodiment of the present invention.

That is to say, as shown in FIG. 4, silicon ions are implanted from the radial direction and the upper main surface direction with implant masks formed in the part of the upper main surface of the SOI substrate 10 where silicon ions are not to be implanted.

This method eliminates the buried oxide film 2 not only in the edge part of the SOI substrate 10 but also over a desired region in the center part. For example, it is possible to remove the buried oxide film 2 in a region about 1 mm inside the outermost part of the edge.

The buried oxide film 2 can be eliminated when the implant depth of silicon ions is deeper than the total of the thickness of the buried oxide film 2 (about 0.05 to 0.5 μm) and the thickness of the SOI layer 1 (about 0.05 to 0.3 μm).

Accordingly, this method is effective when the buried oxide film 2 cannot be eliminated over a desired region only by implanting silicon ions from the radial direction of the SOI substrate 10.

B. Second Preferred Embodiment

A semiconductor substrate processing method and a semiconductor substrate according to a second preferred embodiment of the present invention will now be described referring to FIG. 5 to FIG. 10.

B-1. Processing Method

Figure 5:
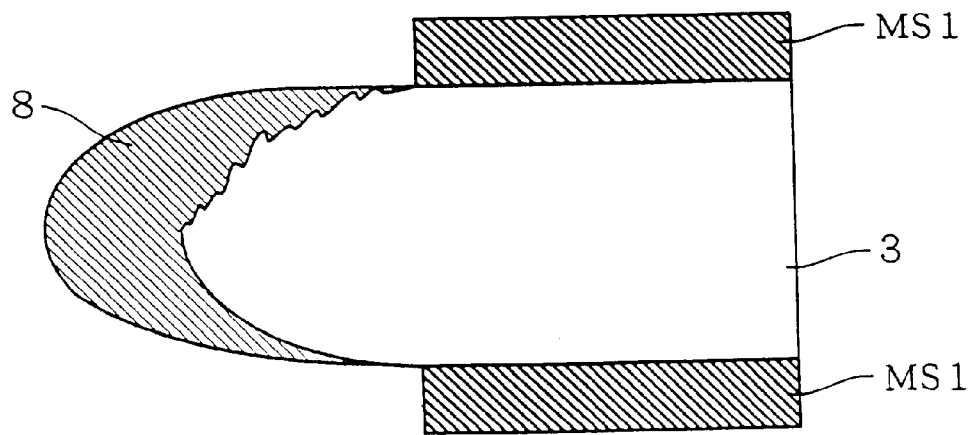
FIGS. 5 and 6 are cross-sectional views used to describe a semiconductor substrate processing process according to a second preferred embodiment of the present invention.

First, as shown in FIG. 5, an oxide film 8 is formed in the edge part of a silicon substrate 3 formed by a CZ (Czochralski) method. In FIG. 5, the oxide film 8 is formed to cover the edge part of the silicon substrate 3. Formed in the center part of the upper and lower main surfaces of the silicon substrate 3 are oxidation preventing masks MS1, where the oxide film 8 is not formed.

The oxide film 8 is formed with its largest thickness; equal to or larger than the total thickness of the buried oxide film and the SOI layer that will be formed in the silicon substrate 3 later. Since the buried oxide film is about 0.05 to 0.5 μm thick and the SOI layer 1 is about 0.05 to 0.3 μm thick, the thickness of the thickest part of the oxide film 8 is about 0.1 to 0.8 μm. The oxide film 8 is formed by a thermal oxidation method under temperature condition of about 900 to 1200° C.

Figure 6:
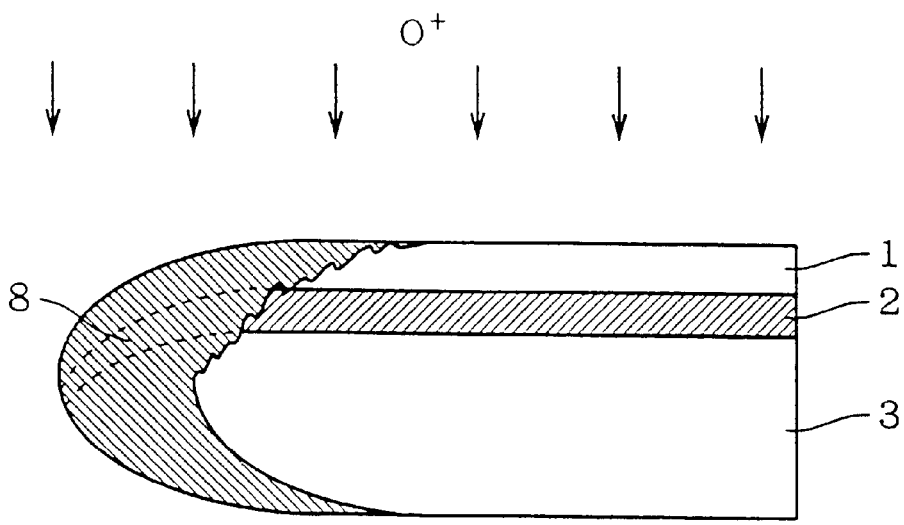

Next, after removing the oxidation preventing masks MS1, oxygen ions are implanted from the upper main surface side of the silicon substrate 3 as shown in FIG. 6 to form a buried oxide film 2 inside the silicon substrate 3 and inside the oxide film 8 by SIMOX method. The oxygen ion implantation and the following annealing are performed under the same conditions as those in the first preferred embodiment, which are not described here again.

The buried oxide film 2 and the oxide film 8 cannot be clearly distinguished in the oxide film 8. The buried oxide film 2 is formed merely as a somewhat oxygen-richer region by the oxygen ion implantation. However, the buried oxide film 2 is shown by broken lines in FIG. 6 to clearly show the structure.

Figure 7:
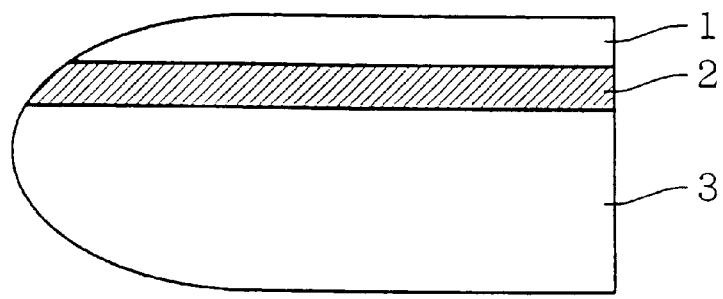
FIG. 7 is a cross-sectional view used to describe the structure of the semiconductor substrate according to the second preferred embodiment of the present invention.

Finally, the oxide film 8 is removed by wet etching by using etching solution, e.g., an HF solution, to obtain an SOI substrate 200 having the buried oxide film 2 extending to the outermost edge in parallel with the main surface, as shown in FIG. 7.

B-2. Characteristic Functions and Effects

According to the above-described second preferred embodiment of the present invention, the buried oxide film 2 is formed to the outermost part of the edge in parallel with the main surface, without a thin SOI layer 1 formed on the buried oxide film 2. This solves the problem that, in the process of thinning the SOI layer 1, for example, a thin SOI layer 1 is partially surrounded by the buried oxide film 2 and an oxide film formed for the thinning process, partially lifted off in removal of the oxide film to be particles, and suspended in the etching solution. This prevents defective formation of semiconductor elements due to the presence of particles, leading to improved production yield.

Further, in the edge part of the SOI substrate 200 shown in FIG. 7, the surface condition is improved, without irregularities. The final condition of the edge surface of the SOI substrate 200 is smooth because the surface of the silicon substrate 3 is oxidized to become the oxide film 8 in the formation of the oxide film 8 in the edge part of the silicon substrate 3 and then the oxide film 8 is removed.

Figure 8:
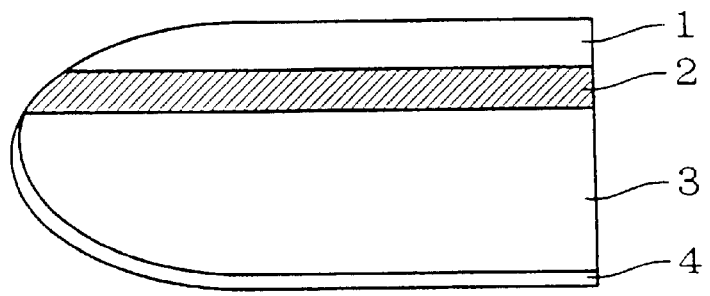
FIG. 8 is a cross-sectional view used to describe a structure of a semiconductor substrate according to the second preferred embodiment of the present invention.

Needless to say, this preferred embodiment is also effective with a structure in which a polysilicon layer is formed on the edge part and the lower main surface of the silicon substrate 3 for gettering of contaminants such as heavy metals. FIG. 8 shows an SOI substrate 200A having a polysilicon layer 4 for gettering.

The polysilicon layer 4 is formed on the edge part and the lower main surface of the silicon substrate 3 prior to the formation of the SOI structure and the oxide film 8 is formed from above the polysilicon layer 4. Accordingly, although the thickness of the polysilicon layer 4 is somewhat reduced in the formation of the oxide film 8, the polysilicon layer 4 remains after the oxide film 8 has been removed after the formation of the SOI structure. The SOI substrate 200A shown in FIG. 8 is thus obtained.

B-3. Modification

The description above has shown an example in which the oxide film 8 is formed by a thermal oxidation method in the edge part of the silicon substrate 3. However, an oxide film 9 may be formed with TEOS (tetraethylorthosilicate) as shown in FIG. 9 (hereinafter referred to as a TEOS film).

Figure 9:
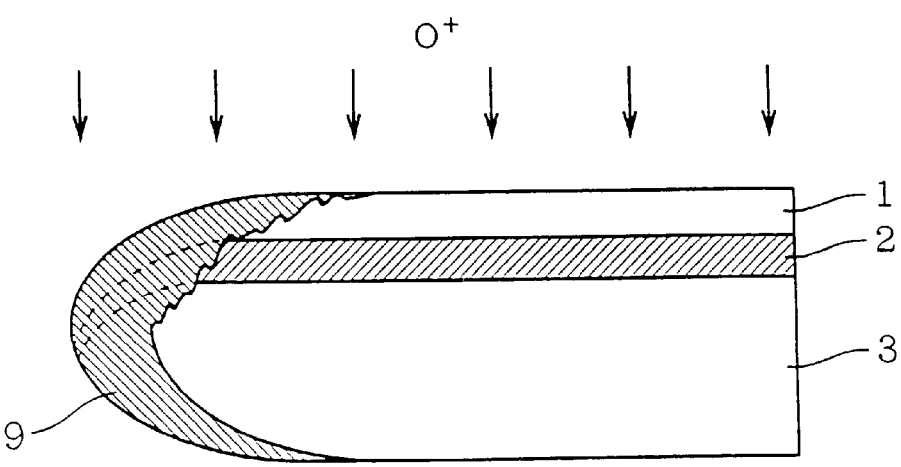
FIG. 9 is a cross-sectional view used to describe the structure of a modification of the semiconductor substrate according to the second preferred embodiment of the present invention.

FIG. 9 corresponds to FIG. 6. This diagram shows the process of forming the TEOS film 9 in the edge part of the silicon substrate 3 and then implanting oxygen ions from the upper main surface side of the silicon substrate 3 to form the buried oxide film 2 inside the silicon substrate 3 and inside the TEOS film 9 by SIMOX.

As shown in FIG. 9, although the buried oxide film 2 is curved in the TEOS film 9, it extends in parallel with the main surface in the silicon substrate 3. Accordingly, when the TEOS film 9 is removed, the same structure as the SOI substrate 200A shown in FIG. 7 is obtained.

The TEOS film 9 is an oxide film formed by a low-pressure CVD method by using TEOS under temperature condition of 650 to 750° C., which is a good oxide film with less pinholes.

Figure 10:
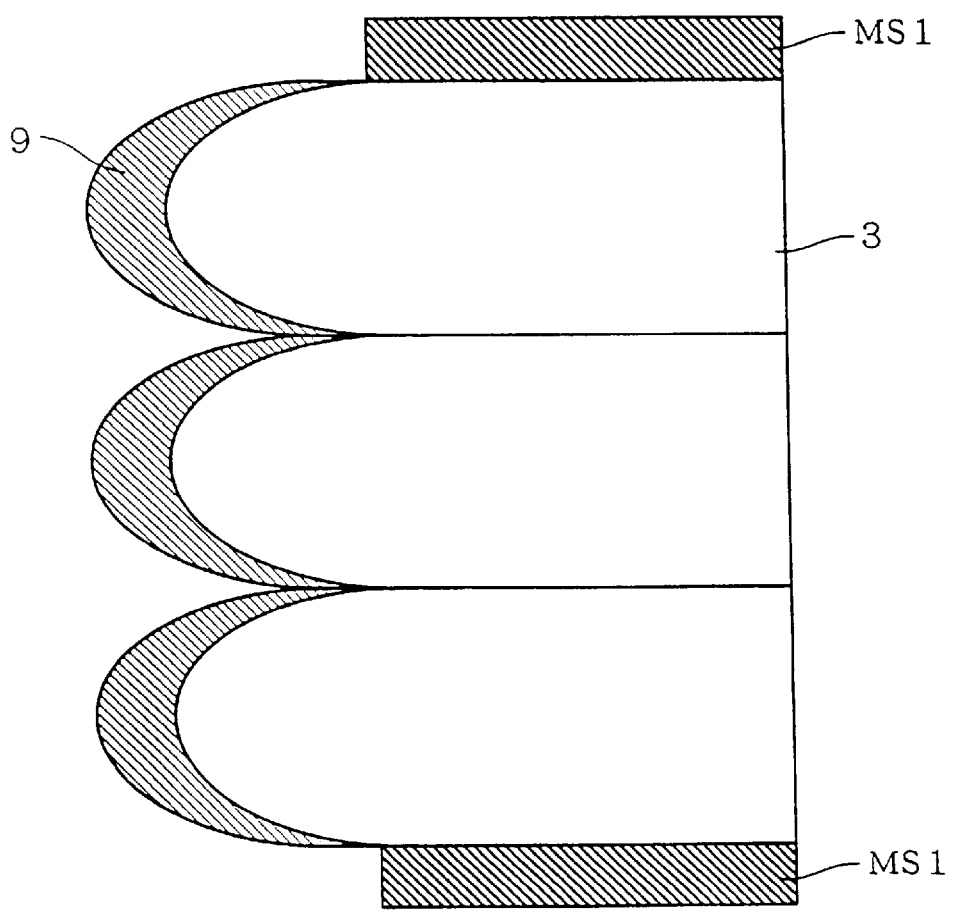
FIG. 10 is a cross-sectional view used to describe a modification of the semiconductor substrate processing process according to the second preferred embodiment of the present invention.

In the formation of the TEOS film 9, when a plurality of silicon substrates 3 are put in low-pressure CVD equipment in a stacked form as shown in FIG. 10, the oxidation preventing masks MS1 can be formed only on the main surfaces of the top and bottom silicon substrates 3. As compared with a case in which the oxidation preventing masks MS1 are formed on each single piece, this improves the manufacturing efficiency.

The same functions and effects can be obtained by forming a nitride film in place of the TEOS film 9. That is to say, any insulating film can be used if it can extend the edge of the silicon substrate 3 so that the curved portion of the buried oxide film 2 can substantially be contained therein, preventing the formation of the curved portion of the buried oxide film 2 in the edge part of the silicon substrate 3.

C. Third Preferred Embodiment

A semiconductor substrate processing method and a semiconductor substrate according to a third preferred embodiment of the present invention will now be described referring to FIG. 11 to FIG. 13.

C-1. Processing Method

Figure 11:
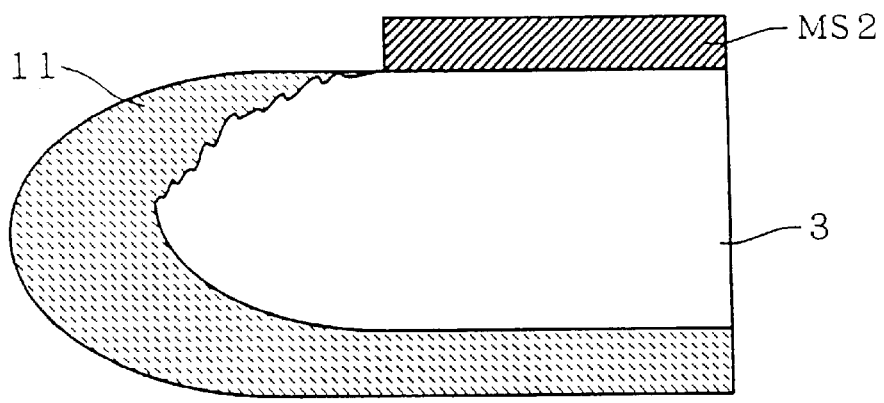
FIGS. 11 and 12 are cross-sectional views used to describe a semiconductor substrate processing process according to a third preferred embodiment of the present invention.

First, as shown in FIG. 11, a doped polysilicon layer 11 is formed in the edge part and the lower main surface of a silicon substrate 3 formed by the CZ method. In FIG. 11, a mask MS2 for preventing the formation of polysilicon is formed in the center part of the upper main surface of the silicon substrate 3, where the doped polysilicon layer 11 is not formed. The doped polysilicon layer 11 is formed with its largest thickness equal to or larger than the total thickness of the buried oxide film and the SOI layer that will be formed in the silicon substrate 3 later. The buried oxide film is about 0.05 to 0.5 $\mu$m thick and the SOI layer 1 is about 0.05 to 0.3 $\mu$m thick, so that the thickness of the thickest part of the doped polysilicon layer 11 is about 0.1 to 0.8 $\mu$m.

The doped polysilicon layer 11 can be formed by in-situ doping by using a gas that contains impurities, e.g., phosphorus or boron, together with a material gas for the polysilicon layer to introduce impurities simultaneously with the formation of the polysilicon layer by a CVD method.

Figure 12:
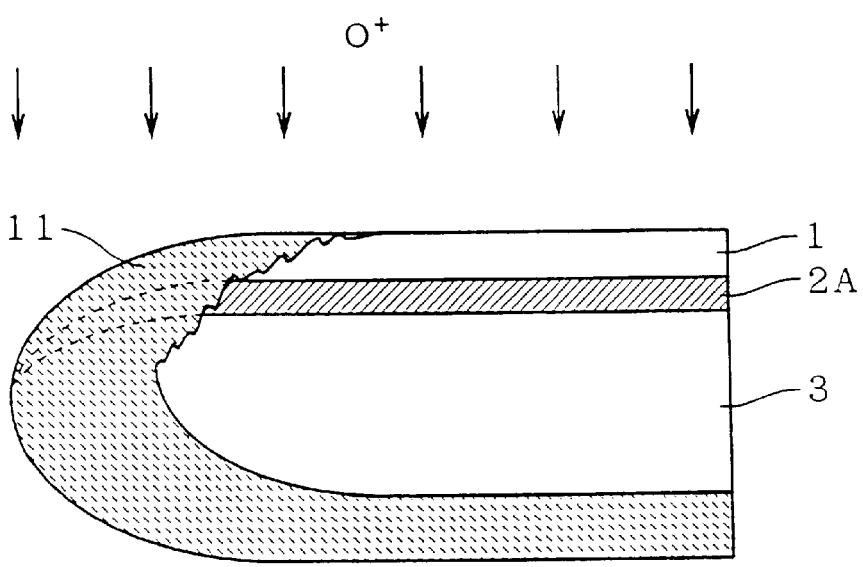

Next, after removal of the polysilicon formation preventing mask MS2, an oxygen ion implantation is applied from the upper main surface side of the silicon substrate 3 as shown in FIG. 12 to form an oxygen-implanted region 2A inside the silicon substrate 3 and inside the doped polysilicon layer 11 by an SIMOX method. FIG. 12 shows the structure before annealing.

Next, the silicon substrate 3 containing the oxygen-implanted region 2A is annealed to diffuse oxygen in the oxygen-implanted region 2A to expand the oxidized region for formation of the buried oxide film 2 and to recover the crystallinity of the silicon substrate 3 for formation of the SOI layer 1. At this time, oxidation rapidly progresses in the doped polysilicon layer 11, because of the difference between the oxidizing rate of the doped polysilicon layer 11 and the oxidizing rate of the silicon substrate 3, to provide an SOI substrate 300 having a thick oxide film 12 (protective oxide film) reaching the surface of the edge part of the doped polysilicon layer 11 as shown in FIG. 13. The oxidizing rates of doped polysilicon and single-crystal silicon are in a ratio of about 2 to 1. The oxygen ion implant and the annealing after the implant are applied under the same conditions as those described in the first preferred embodiment, and therefore they are not described here again.

C-2. Characteristic Functions and Effects

Figure 13:
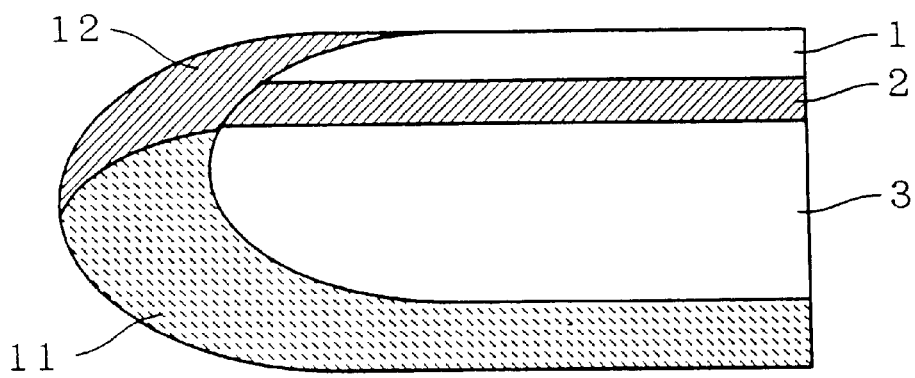
FIG. 13 is a cross-sectional view used to describe the structure of the semiconductor substrate according to the third preferred embodiment of the present invention.

According to the above-described third preferred embodiment of the present invention, as shown in FIG. 13, the doped polysilicon layer 11 is composed of the oxide film 12 in the edge part on the upper main surface side at least, without a thin SOI layer 1 formed on the buried oxide film 2. This prevents the problem that, in the process of thinning the SOI layer 1, for example, a thin SOI layer 1 is partially surrounded by the buried oxide film 2 and an oxide film formed for the thinning process, partially lifted off to form particles in removal of the oxide film, and suspended in etching solution. This prevents defective formation of semiconductor elements due to the presence of particles, leading to improvement of the production yield.

In the edge part of the SOI substrate 300 shown in FIG. 13, the surface condition of the silicon substrate 3 is improved, with no irregularities. This is because the surface of the silicon substrate 3 is oxidized to become the oxide film 12 in oxidization of the doped polysilicon layer 11.

The doped polysilicon layer 11 may be left in the edge part and the lower main surface of the silicon substrate 3 to be used as a gettering layer for gettering of contaminants like heavy metals in the silicon substrate 3.

D. Fourth Preferred Embodiment

A semiconductor substrate processing method and a semiconductor substrate according to a fourth preferred embodiment of the present invention will now be described referring to FIG. 14 to FIG. 16.

D-1. Processing Method

First, an oxygen ion implantation (a first implantation) is applied from the upper main surface side of a silicon substrate 3 formed by a CZ method to form a first oxygen-implanted region. Then annealing is applied to form a buried oxide film 2 inside the silicon substrate 3. The oxygen ion implantation and the following annealing are performed under the same conditions as the first preferred embodiment, which are not described here again.

Figure 14:
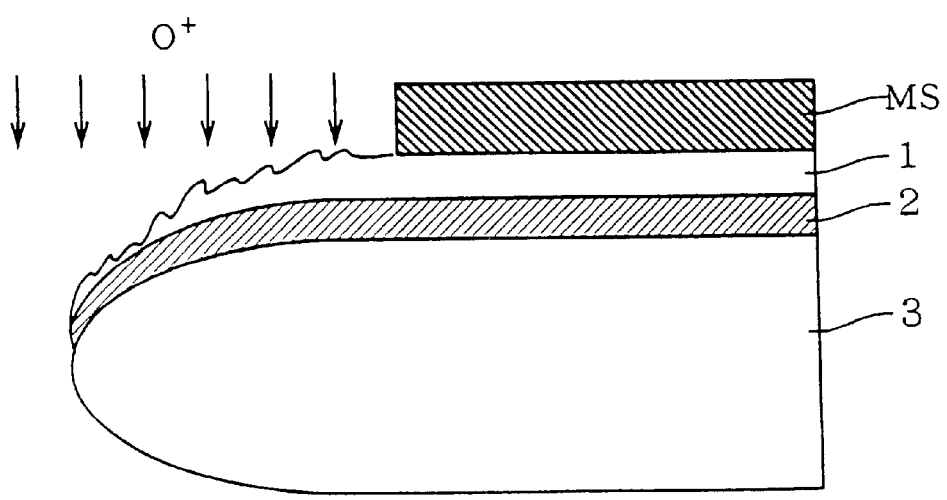
FIG. 14 is a cross-sectional view used to describe a semiconductor substrate processing process according to a fourth preferred embodiment of the present invention.

After that, as shown in FIG. 14, an implant mask MS is formed in the center part of the upper main surface of the silicon substrate 3 and an oxygen ion implantation (a second implantation) is applied from the upper main surface side of the silicon substrate 3 to form an oxygen-implanted region on the buried oxide film 2 in the edge part. The oxygen ion implantation is performed under the conditions of an energy of about 50 KeV and doses of $1 \times 10^{18}$ to $2 \times 10^{18}/cm^2$.

After that, annealing is applied to facilitate oxidation to form an oxide film 13 (protective oxide film) that reaches the surface of the silicon substrate 3 above the buried oxide film 2 in the edge part. The SOI substrate 400 shown in FIG. 15 is thus obtained.

The processes of annealing for the formation of the buried oxide film 2 and for the formation of the oxide film 13 are performed under almost the same conditions. Therefore the buried oxide film 2 and the oxide film 13 may be formed at the same time by applying an annealing process after the first and second oxygen ion implantation processes.

D-2. Characteristic Functions and Effects

Figure 15:
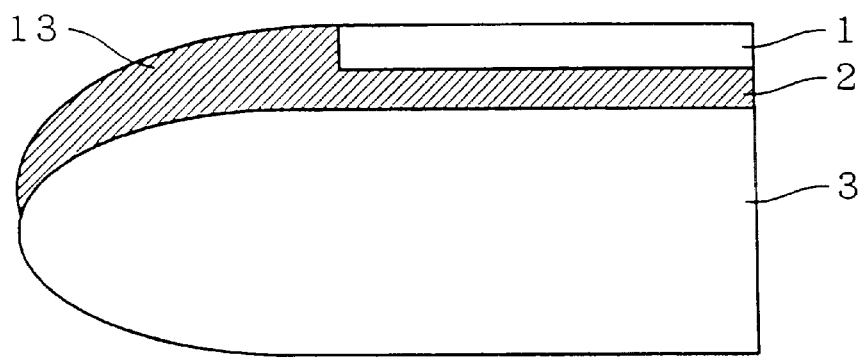
FIG. 15 is a cross-sectional view used to describe the structure of the semiconductor substrate according to the fourth preferred embodiment of the present invention.
Figure 16:
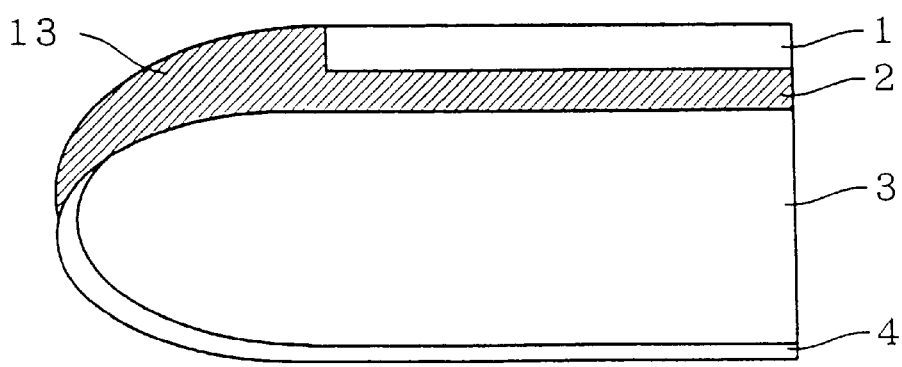
FIG. 16 is a cross-sectional view used to describe a structure of a semiconductor substrate according to the fourth preferred embodiment of the present invention.

According to the above-described fourth preferred embodiment of the present invention, as shown in FIG. 15, the edge part on the upper main surface side of the SOI substrate 400 is formed of the oxide film 13, without a thin SOI layer 1 formed on the buried oxide film 2. Accordingly, for example, in the process of thinning the SOI layer 1, this prevents the problem that a thin SOI layer 1 is partially surrounded by the buried oxide film 2 and an oxide film formed for thinning, partially lifted off in removal of the oxide film to form particles, and suspended in the etching solution. This prevents defective formation of semiconductor elements due to the presence of particles, leading to improved production yield.

Similarly to the buried oxide film 2, the oxide film 13 can be formed by using an ion implantation method and grown by annealing. It is therefore not necessary to use extra devices or to add extra process steps for the formation of the oxide film 13, which suppresses an increase in production cost.

When the buried oxide film 2 and the oxide film 13 are annealed in separate process steps, these oxide films can be treated with good controllability for thickness.

Needless to say, this preferred embodiment is effective also with a structure in which a polysilicon layer is formed on the edge part and the lower main surface of the silicon substrate 3 for gettering of contaminants such as heavy metals. FIG. 16 shows an SOI substrate 400A having a polysilicon layer 4 for gettering.

E. Fifth Preferred Embodiment

A semiconductor substrate processing method and a semiconductor substrate according to a fifth preferred embodiment of the present invention will now be described referring to FIG. 17 to FIG. 19.

E-1. Processing Method

First, oxygen ions are implanted (a first implantation) into a silicon substrate 3 formed by the CZ method from the upper main surface side to form a buried oxide film 2 inside the silicon substrate 3 by the SIMOX method. The oxygen ion implantation and annealing after the implantation are performed under the same conditions as those in the first preferred embodiment, which are not described here again.

Figure 17:
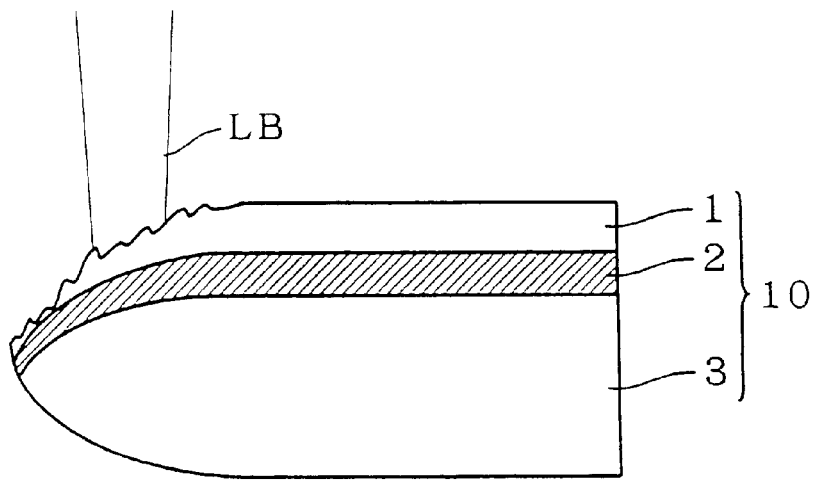
FIG. 17 is a cross-sectional view used to describe a semiconductor substrate processing process according to a fifth preferred embodiment of the present invention.

After that, as shown in FIG. 17, a laser beam LB is applied from above to the edge part of the silicon substrate 3 in a vacuum. An Nd-YAG laser (with a wavelength 1.06 $\mu$m) is used as the laser source, with a laser output of about 3 to 5 W (watts), for example. The spot size of the laser beam LB is about 2 to 3 $\mu$m.

The application of the laser beam LB under the above-described conditions melts the irradiated part, so that the SOI layer 1 and the buried oxide film 2 are mixed together. Then, as shown in FIG. 18, an SOI substrate 500 having a molten layer 14 in the edge part on, at least, the upper main surface side of the substrate is obtained.

As for the composition of the molten layer 4, it is known that the oxide film is at least silicon-richer than $SiO_2$. However, the phenomenon that silicon and silicon oxide film are melted with a laser beam falls within an unknown filed. Since neither the inventors nor others have found the composition of the molten layer 14 in research, the composition of the molten layer 14 is assumed to be $SiO_X$.

Figure 19:
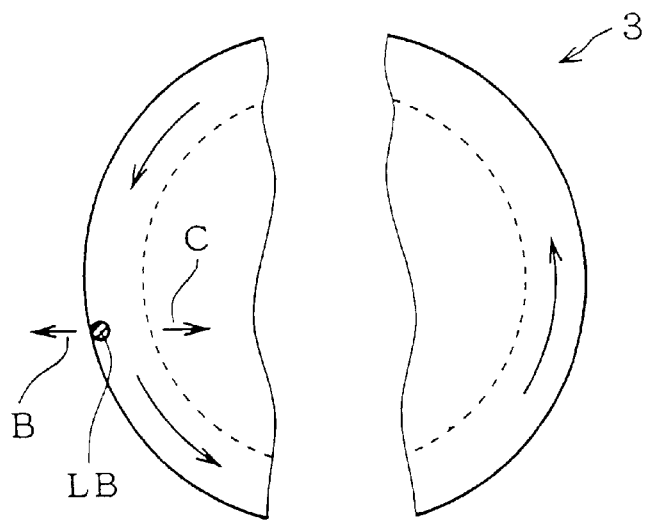
FIG. 19 is a plane view used to describe the semiconductor substrate processing process according to the fifth preferred embodiment of the present invention.

To apply the laser beam LB uniformly all over to the edge part of the silicon substrate 3, the silicon substrate 3 is rotated in the direction shown by the arrow A with the laser beam LB fixed in a position in the edge part as shown in FIG. 19, for example. After the silicon substrate 3 has been rotated once, the laser beam LB is moved in the direction shown by the arrow B or C and fixed there, and the silicon substrate 3 is turned again. Repeating this operation allows the laser beam LB to be applied uniformly all over in the edge part of the silicon substrate 3.

Although the number of revolutions of the silicon substrate 3 and the irradiation time for each point depend on the intensity and spot size of the laser beam LB, it is known that the silicon substrate 3 can be melted almost in an instant with the above-described specification of the laser beam LB.

E-2. Characteristic Functions and Effects

Figure 18:
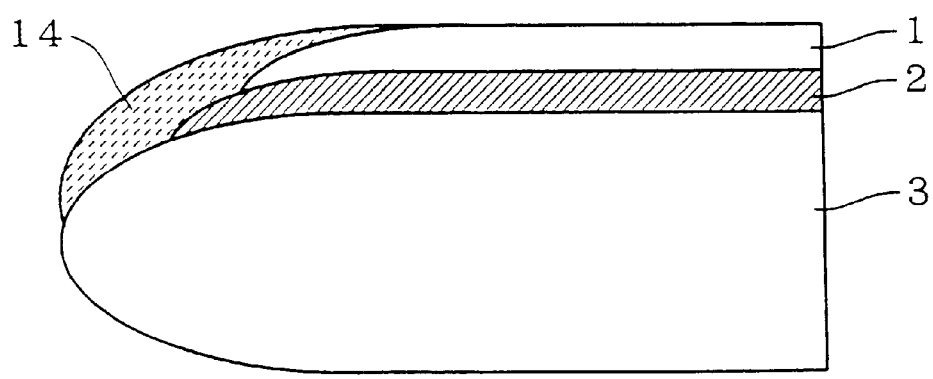
FIG. 18 is a cross-sectional view used to describe the structure of the semiconductor substrate according to the fifth preferred embodiment of the present invention.

According to the above-described fifth preferred embodiment of the present invention, as shown in FIG. 18, the edge part of the upper main surface side of the SOI substrate 500 is composed of the molten layer 14, which eliminates the irregularities on the edge part of the silicon substrate 3 and also eliminates the presence of a thin SOI layer 1 on the buried oxide film 2. This solves the problem that, in the process of thinning the SOI layer 1, for example, a thin SOI layer 1 is partially surrounded by the buried oxide film 2 and an oxide film formed for thinning, partially lifted off in removal of the oxide film to be particles, and suspended in the etching solution. This prevents defective formation of semiconductor elements due to the presence of particles, leading to improvement of the production yield.

Although marking with a laser beam to a silicon substrate (marking for discrimination of silicon substrates) is generally known, it is recognized merely as a marking method. Generally, the composition of the marked part has not been sufficiently studied. As a matter of course, there has never been the technical idea of preventing formation of particles from SOI substrate, by using a laser beam.

The inventors and others have paid attention to the phenomenon that silicon evaporates and melts in a silicon substrate marking process with a laser beam and found that the application of a laser beam to a two-layer structure of a silicon layer and a silicon oxide film causes the silicon layer and the silicon oxide film to be mixed to form an oxide film silicon-richer than an ordinary silicon oxide film. On the basis of this finding, we have reached the technical idea of preventing formation of particles with SOI substrates by using a silicon-rich oxide film obtained by melting.

Although this preferred embodiment has shown an example in which a laser beam is applied to an SOI substrate to melt the buried oxide film 2 and the SOI layer 1, a silicon-richer oxide film can be obtained by melting any two-layer structure of a silicon layer and a silicon oxide film with an application of a laser beam. For example, needless to say, a silicon-richer oxide film can be obtained also with a structure in which a silicon oxide film is formed on a silicon layer.

The above-described first to fifth preferred embodiments have shown the invention in terms of prevention of formation of particles with SOI substrates formed by the SIMOX method. In the following sixth to eighth preferred embodiments of the present invention, the invention will be described with respect to prevention of formation of particles with SOI substrates formed by bonding method (bonded SOI substrates).

F. Sixth Preferred Embodiment

A semiconductor substrate processing method and a semiconductor substrate according to a sixth preferred embodiment of the present invention will now be described referring to FIG. 20 and FIG. 21.

F-1. Processing Method

Figure 20:
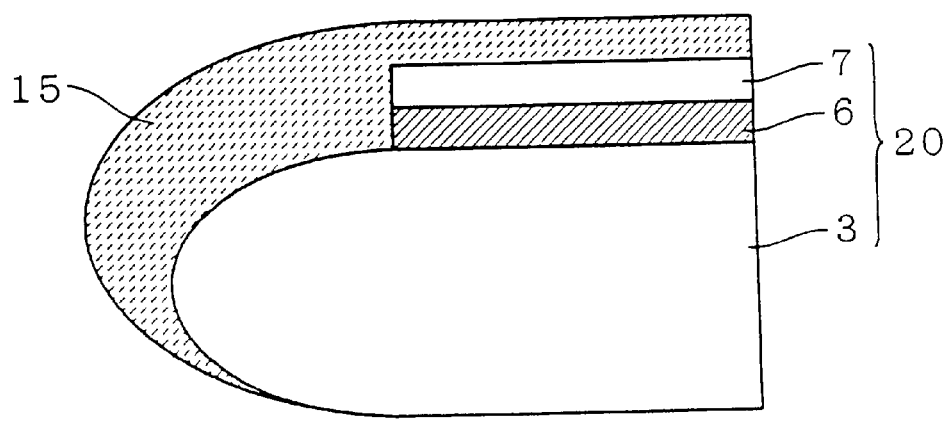
FIG. 20 is a cross-sectional view used to describe a semiconductor substrate processing process according to a sixth preferred embodiment of the present invention.

First, as shown in FIG. 20, a bonded SOI substrate 20 is prepared, which includes an on-substrate oxide film 6 and a silicon layer 7 sequentially stacked on the upper main surface of a silicon substrate 3 to form an SOI structure. The SOI structure of the bonded SOI substrate 20 is obtained by forming an oxide film on the upper main surface of the silicon substrate 3, bonding another silicon. substrate thereon, and then polishing that silicon substrate to a desired thickness. The thickness of the on-substrate oxide film 6 is about 0.1 to 1.0 $\mu$m and the thickness of the silicon layer 7 is about 0.1 to 0.3 $\mu$m. The on-substrate oxide film 6 corresponds to the buried oxide film and the silicon layer 7 corresponds to the SOI layer.

Subsequently, an epitaxial layer 15 is formed to cover the edge part of the upper main surface of the SOI substrate 20, the on-substrate oxide film 6, and the silicon layer 7. The epitaxial layer 15 is formed by exposing the SOI substrate 20 to a gas atmosphere of trichlorosilane ($SiHCl_3$) under temperature condition of 1150 to 1200° C., for example. A mask is formed on the lower main surface and the edge part of the lower main surface side of the substrate where the formation of the epitaxial layer 15 is unwanted.

Since the growth rate of the epitaxial layer 15 is 0.5 to 3.0 $\mu$m/min, it takes about one minute to become thick enough to cover the on-substrate oxide film 6 and the silicon layer 7.

Figure 21:
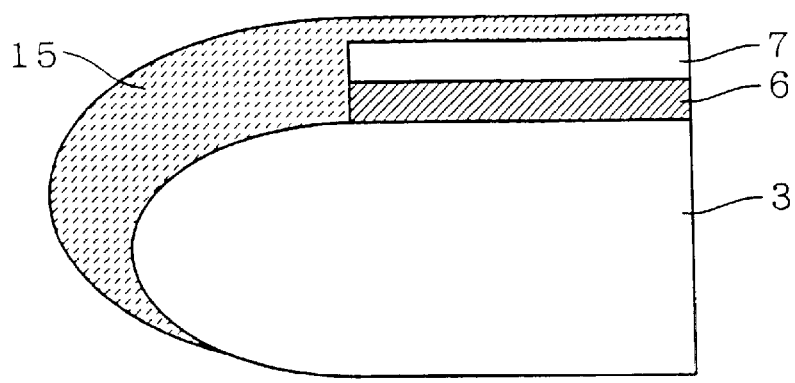
FIG. 21 is a cross-sectional view used to describe the structure of the semiconductor substrate according to the sixth preferred embodiment of the present invention.

Next, as shown in FIG. 21, the epitaxial layer 15 is polished to form a flat surface above the silicon layer 7 to provide an SOI substrate 600 having the epitaxial layer 15 covering the edge part of the on-substrate oxide film 6 and the silicon layer 7.

F-2. Characteristic Functions and Effects

According to the above-described sixth preferred embodiment of the present invention, as shown in FIG. 21, the edge part of the on-substrate oxide film 6 and the silicon layer 7 is covered with the epitaxial layer 15. This prevents the problem that, in wet etching for thinning the SOI layer (silicon layer 7), for example, the on-substrate oxide film 6 is partially removed to cause the silicon layer 7 thereon to be partially hung off. This prevents the silicon layer 7 from coming off to form particles.

Even if the edge part of the on-substrate oxide film 6 and the silicon layer 7 is imperfectly beveled and its periphery has successive irregularities in a plane view, the irregularities are covered by the epitaxial layer 15. Hence, the on-substrate oxide film 6 and the silicon layer 7 will not be peeled off to form particles in transportation of the substrate.

The description above has shown an example in which the epitaxial layer 15 having good crystallinity is left on the silicon layer 7 and used as an SOI layer. However, as long as the on-substrate oxide film 6 and the silicon layer 7 are covered, it may be removed from above the silicon layer 7.

G. Seventh Preferred Embodiment

A semiconductor substrate processing method and a semiconductor substrate according to a seventh preferred embodiment of the present invention will now be described referring to FIG. 22 and FIG. 23.

G-1. Processing Method

First, a bonded SOI substrate 20 is prepared, which has an on-substrate oxide film 6 and a silicon layer 7 sequentially stacked on the upper main surface of a silicon substrate 3 to form an SOI structure.

Figure 22:
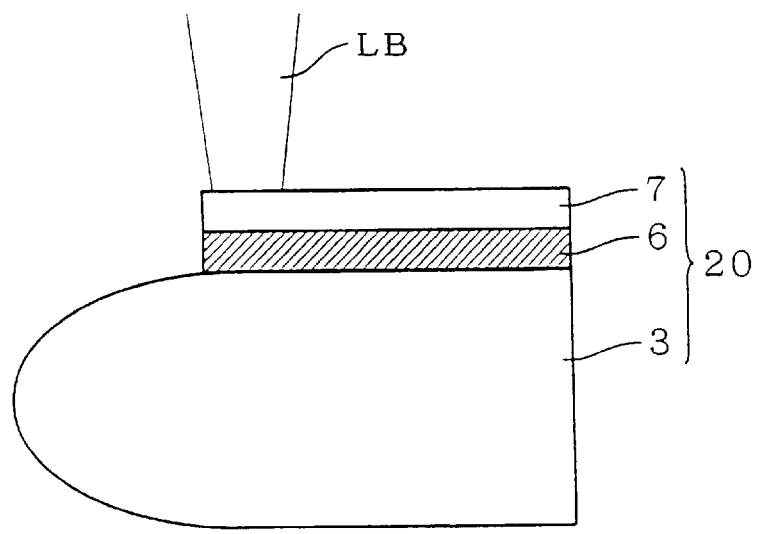
FIG. 22 is a cross-sectional view used to describe a semiconductor substrate processing process according to a seventh preferred embodiment of the present invention.

Subsequently, as shown in FIG. 22, a laser beam LB is applied to the edge part of the on-substrate oxide film 6 and the silicon layer 7 from above. An Nd-YAG laser (having a wavelength of 1.06 $\mu$m) is used as the laser source, with a laser output of about 3 to 5 W (watts), for example. The spot size of the laser beam LB is about 2 to 3 $\mu$m.

The application of the laser beam LB under the above-described condition causes the irradiated part to melt so that the silicon layer 7 and the on-substrate oxide film 6 are mixed together. Then, as shown in FIG. 23, an SOI substrate 700 is obtained with the edge part of the on-substrate oxide film 6 and the silicon layer 7 covered with a molten layer 16.

The phenomenon that the on-substrate oxide film 6 and the silicon layer 7 melt is the same as the phenomenon that a silicon layer and a silicon oxide film melt as described in the fifth preferred embodiment, which is not fully described again here.

G-2. Characteristic Functions and Effects

Figure 23:
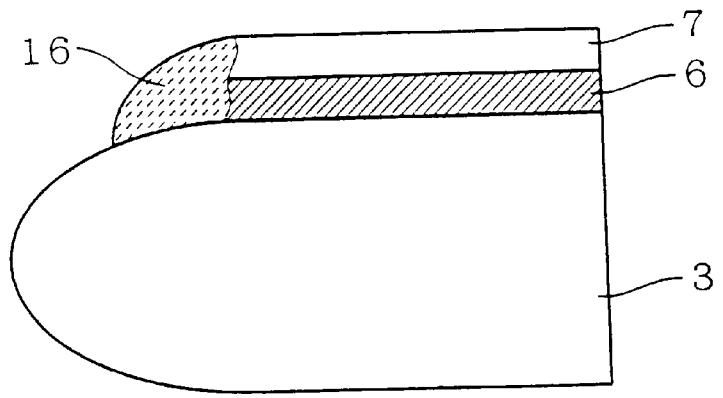
FIG. 23 is a cross-sectional view used to describe the structure of the semiconductor substrate according to the seventh preferred embodiment of the present invention.

According to this preferred embodiment of the present invention, as shown in FIG. 23, the edge part of the on-substrate oxide film 6 and the silicon layer 7 in the SOI substrate 700 is covered by the molten layer 16. in the wet etching for thinning the SOI layer (silicon layer 7), for example, this prevents the on-substrate oxide film 6 from being partially removed to partially put the silicon layer 7 thereon in a hanging state. This prevents the silicon layer 7 from coming off to be particles.

Even if the edge part of the on-substrate oxide film 6 and the silicon layer 7 is imperfectly beveled to form continuous irregularities along the periphery in a plane view, the irregularities are covered with the molten layer 16. This prevents the on-substrate oxide film 6 and the silicon layer 7 from coming off to form particles in transportation of the substrate.

H. Eighth Preferred Embodiment

A semiconductor substrate processing method and a semiconductor substrate according to an eighth preferred embodiment of the present invention will now be described referring to FIG. 24 to FIG. 27.

H-1. Processing Method

Figure 24:
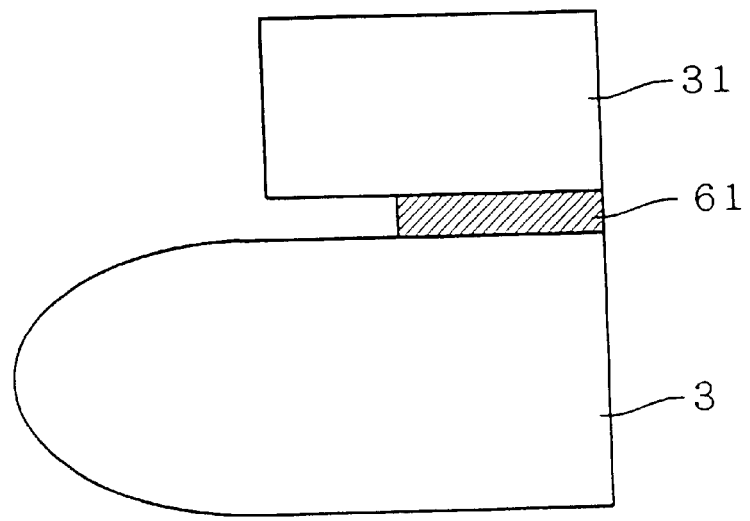
FIGS. 24 to 26 are cross-sectional views used to describe a semiconductor substrate processing process according to an eighth preferred embodiment of the present invention.

First, as shown in FIG. 24, an on-substrate oxide film 61 is formed on the upper main surface of a silicon substrate 3 and then a silicon substrate 31 is bonded thereon. At this time, the dimension of the silicon substrate 31 in the plane direction is larger than that of the on-substrate oxide film 61. Accordingly, in the structure, the edge of the silicon substrate 31 protrudes like a visor from the edge of the on-substrate oxide film 61. The structure shown in FIG. 24 may be obtained by bonding an on-substrate oxide film 61 and a silicon substrate 31 having the same dimension in the plane direction and then etching the edge part of the on-substrate oxide film 61 by a wet etching with HF or the like.

Figure 25:
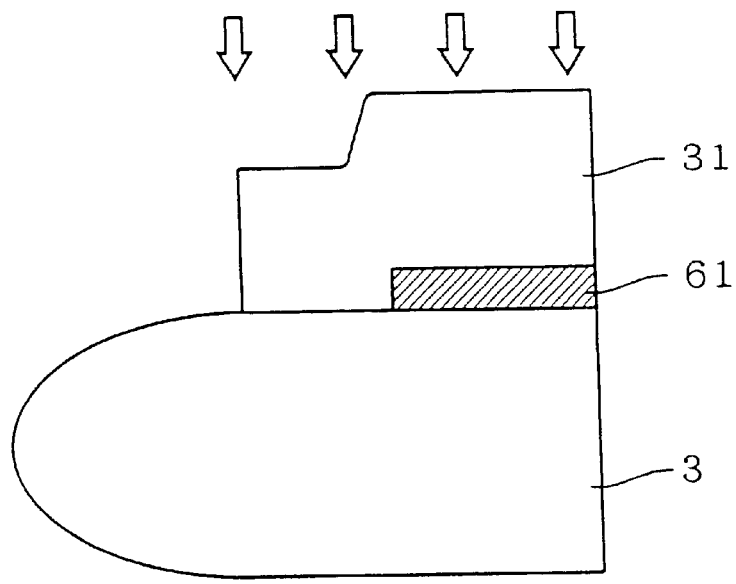
Figure 26:
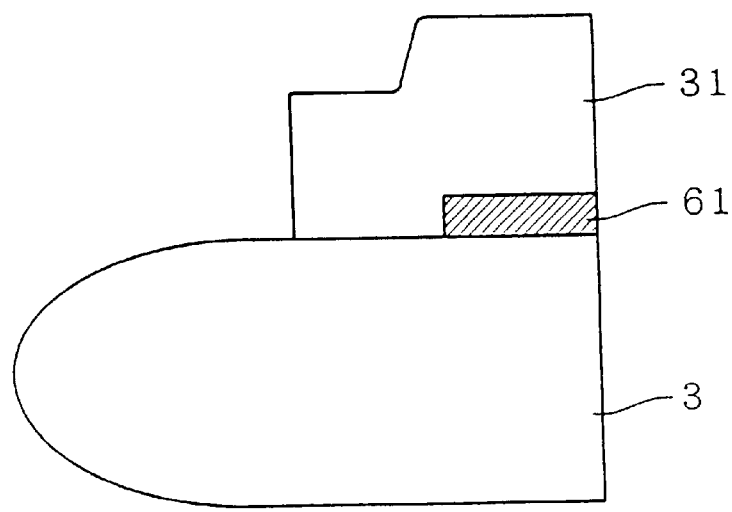

Next, as shown by the arrows in FIG. 25, pressures are applied to the silicon substrate 31 from above to bend the edge part of the silicon substrate 31 so that that part comes into contact with the surface of the silicon substrate 3. Then, the silicon substrate 31 and the silicon substrate 3 are bonded together to provide the structure, as shown in FIG. 26, where the on-substrate oxide film 61 is covered with the silicon substrate 31. The bonding is performed by using a common technique like a heating method, which is not described here in detail.

Figure 27:
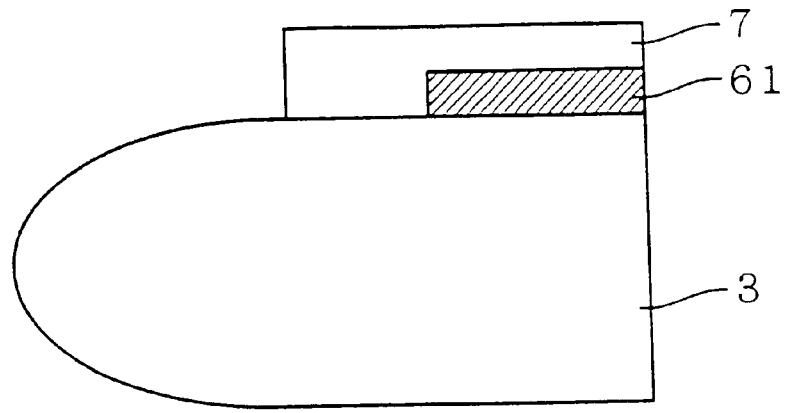
FIG. 27 is a cross-sectional view used to describe the structure of the semiconductor substrate according to the eighth preferred embodiment of the present invention.

Finally, the silicon substrate 31 is polished to a certain thickness to form a silicon layer 7, thus providing an SOI substrate 800 in which the on-substrate oxide film 61 is covered by the silicon layer 7 as shown in FIG. 27.

H-2. Characteristic Functions and Effects

According to the above-described eighth preferred embodiment of the present invention, as shown in FIG. 27, the on-substrate oxide film 61 is covered with the silicon layer 7. This prevents the problem that the on-substrate oxide film 61 is partially removed to put the silicon layer 7 thereon in a partially hanging state in the wet etching for thinning the SOI layer (silicon layer 7), for example. This prevents the silicon layer 7 from coming off to form particles.

I. Ninth Preferred Embodiment

A semiconductor substrate processing method and a semiconductor substrate according to a ninth preferred embodiment of the present invention will now be described referring to FIG. 28 to FIG. 31.

I-1. Processing Method

Figure 28:
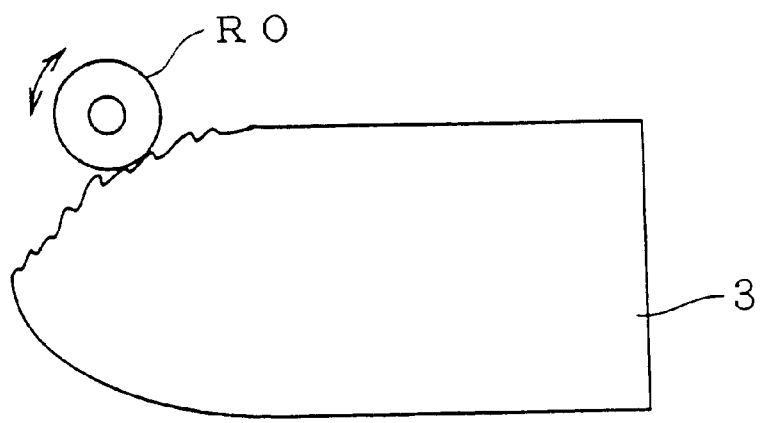
FIG. 28 is a cross-sectional view used to describe a semiconductor substrate processing process according to a ninth preferred embodiment of the present invention.

The surface of the edge part of a silicon substrate 3 formed by a CZ method and having irregularities on the edge part is polished by a roller polishing as shown in FIG. 28. In the roller polishing, a rotating roller having an abrasive on its cylindrical surface is brought into contact with an object to polish the object. In this preferred embodiment, a roller RO is brought into contact with the edge part of the silicon substrate 3 to polish that part.

It is desirable to polish that part into a mirror-like state, to the same extent as the upper main surface of the silicon substrate 3, with a surface roughness of about 5 to 10 angstroms.

Figure 29:
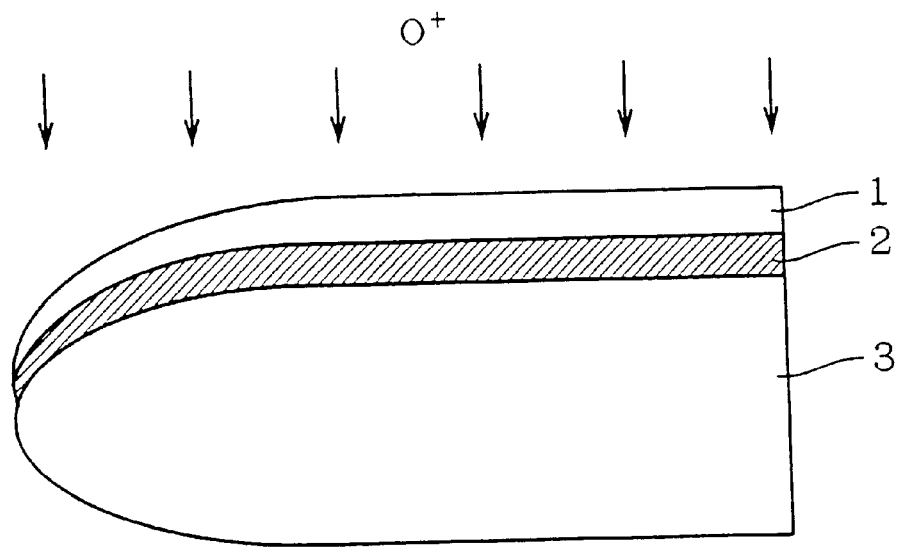
FIG. 29 is a cross-sectional view used to describe the structure of the semiconductor substrate according to the ninth preferred embodiment of the present invention.

Next, as shown in FIG. 29, oxygen ions are implanted from the upper main surface side of the silicon substrate 3 to form a buried oxide film 2 inside the silicon substrate 3 by the SIMOX method, to provide an SOI substrate 900 having a smooth edge. The oxygen ion implantation and annealing after the implantation are performed under the same conditions as those described in the first preferred embodiment, which are not described here again.

I-2. Characteristic Functions and Effects

According to the above-described ninth preferred embodiment of the present invention, the edge part of the silicon substrate 3 is brought into a mirror-like state and then the buried oxide film 2 is formed inside the silicon substrate 3 by SIMOX method. Accordingly, although a thin SOI layer 1 is formed on the buried oxide film 2, the surface condition of the SOI layer 1 in that part is smooth. In the process of thinning the SOI layer 1, for example, this prevents the problem that a thin SOI layer 1 is partially surrounded by the buried oxide film 2 and an oxide film formed for thinning to be partially lifted off in removal of the oxide film and forms particles suspended in the etching solution. This prevents defective formation of semiconductor elements due to the presence of particles, leading to improvement of the production yield.

I-3. Modification

Although the description above has shown an example in which the edge part of the silicon substrate 3 is polished prior to the formation of the buried oxide film 2, the edge part of the silicon substrate 3 may be polished after the buried oxide film 2 has been formed, which provides the same effects.

Figure 30:
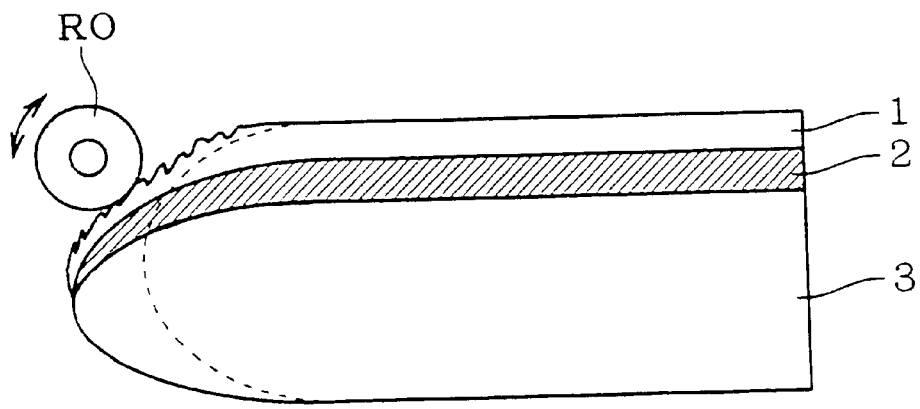
FIG. 30 is a cross-sectional view used to describe a modification of the semiconductor substrate processing process according to the ninth preferred embodiment of the present invention.
Figure 31:
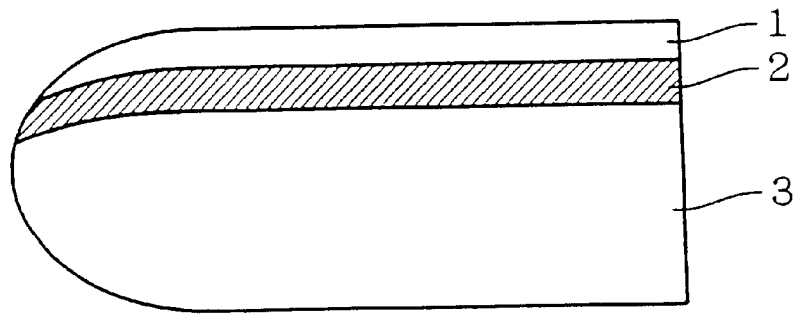
FIG. 31 is a cross-sectional view used to describe the structure of the modification of the semiconductor substrate according to the ninth preferred embodiment of the present invention.
Figure 32:
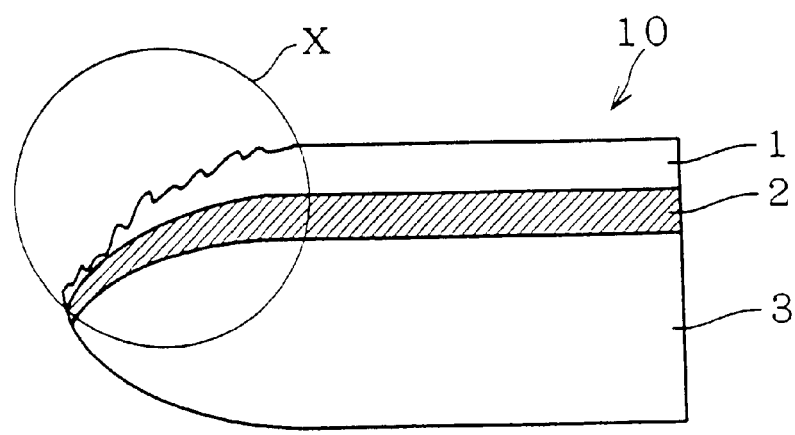
FIG. 32 is a cross-sectional view used to describe the structure of an SOI structure formed on a semiconductor substrate formed by a CZ method.
Figure 33:
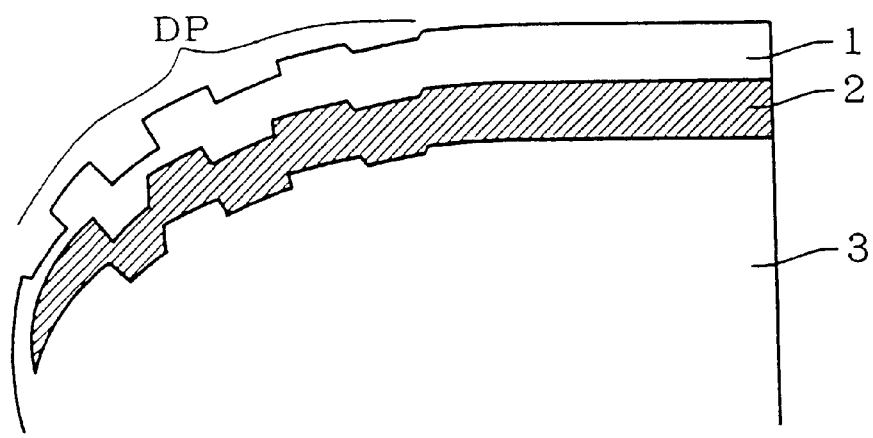
FIG. 33 is a cross-sectional view used to describe the structure of the edge part of the SOI substrate.
Figure 34:
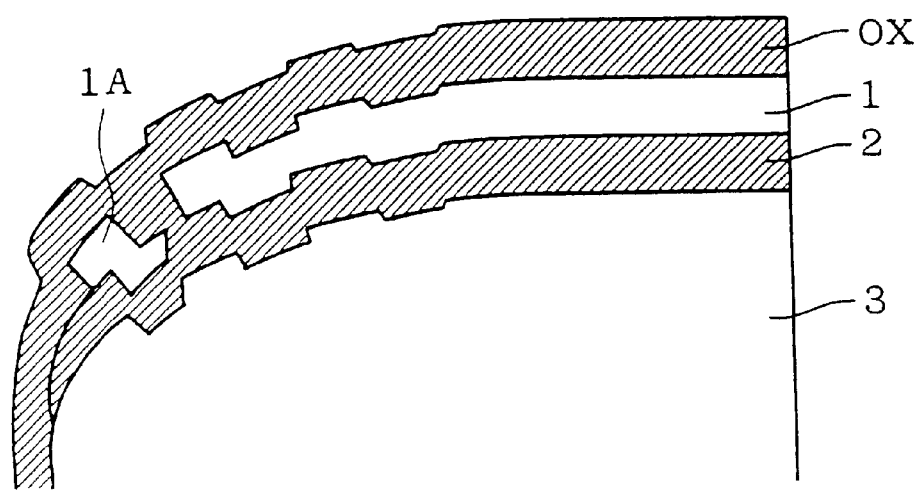
FIGS. 34 and 35 are cross-sectional views used to describe a problem in a conventional SOI substrate processing method.
Figure 35:
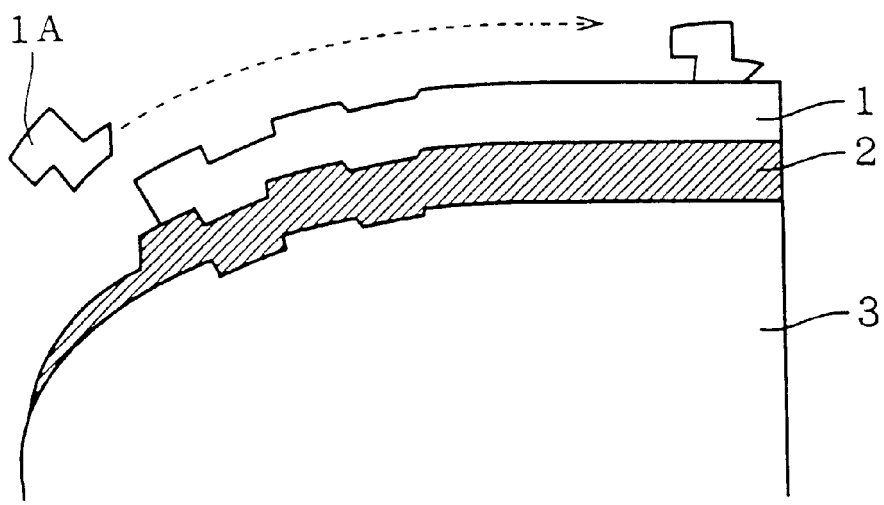
Figure 36:
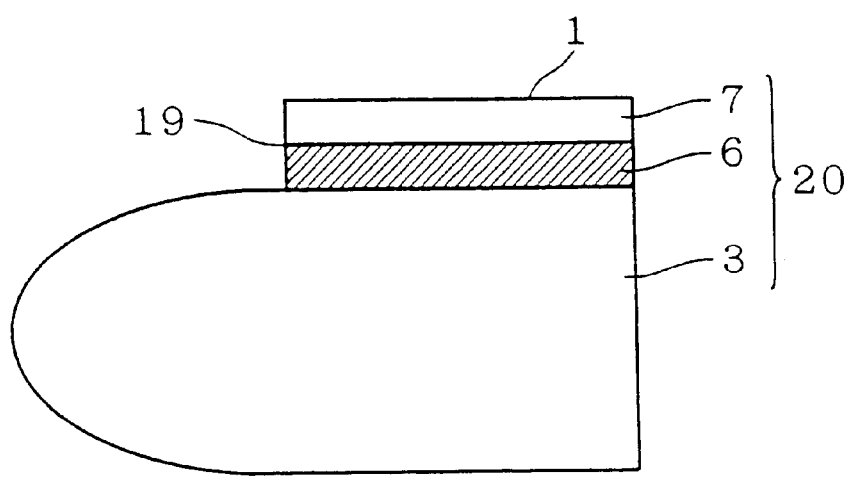
FIGS. 36 and 37 are cross-sectional views used to describe a problem of an SOI substrate formed by a bonding method.
Figure 37:
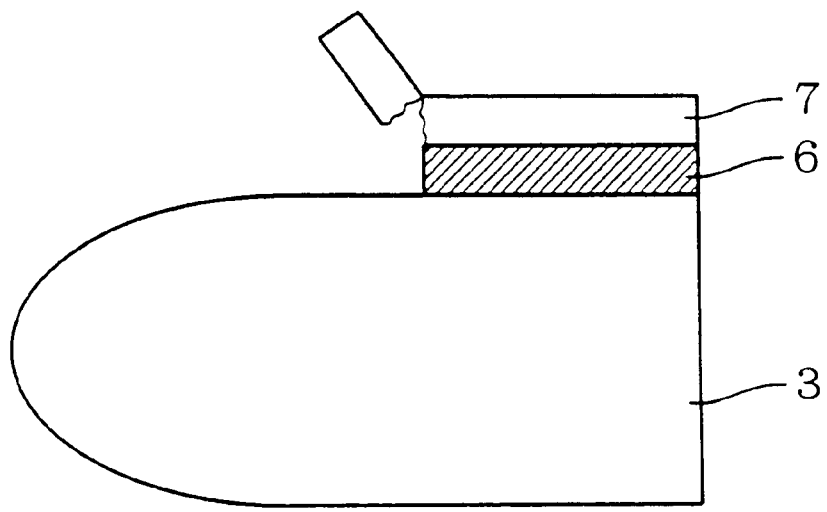

More specifically, as shown in FIG. 30, a buried oxide film 2 is formed in a silicon substrate 3 having irregularities in the edge part and then the edge part of the silicon substrate 3 is removed by a roller polishing. Then, as shown in FIG. 31, an SOI substrate 900A having a buried oxide film 2 extending in parallel with the main surface to the outermost part of the edge can be obtained. Accordingly, a thin SOI layer 1 is not formed on the buried oxide film 2. This prevents the problem that a thin SOI layer 1 is partially surrounded by the buried oxide film 2 and an oxide film formed for thinning and partially lifted off in removal of the oxide film to be particles suspended in etching solution. This prevents defective formation of the semiconductor elements due to the presence of the particles, leading to the improvement of the production yield.

The above-described first to ninth preferred embodiments of the present invention have shown examples in which the SOI substrates haste irregularities in edge part and examples in which they have polysilicon layers for gettering. However, the applications of the present invention are not limited to SOI substrates. When a bulk silicon substrate having irregularities in the edge part or a polysilicon layer for gettering suffers from the problem of particles from the edge part, the present invention can be applied to prevent the formation of particles. Further, the present invention is also effective when an SOI substrate having no irregularities in the edge part suffers from the problem of the formation of particles due to the presence of thin SOI layer or buried oxide film in the edge part.

Although it has not been described in the above first to ninth preferred embodiments of the invention, the SOI substrates obtained by the invention are used not only for production of particular semiconductor devices. Needless to say, various semiconductor elements, such as MOS transistors and bipolar transistors, can be built in the SOI layers to produce various semiconductor devices, such as DRAMs, SRAMs, logic circuits, etc.

While the invention has been described in detail, the foregoing description is in all aspects illustrative and not restrictive. It is understood that numerous other modifications and variations can be devised without departing from the scope of the invention.

We claim:

1. A semiconductor substrate having a first main surface, a second main surface on the opposite side, and a side part, wherein a part where an active region is formed in said first main surface is defined as a center part, and a part including a peripheral region around said center part in said first main surface and said side part is defined as an edge part, said semiconductor substrate comprising:

a buried oxide film and an SOI layer formed in said first main surface in a sequentially stacked forms;

a doped polysilicon layer formed in said edge part to cover said edge part; and a protective oxide film formed in said doped polysilicon layer in said edge part on the side of said first main surface from the surface to the buried oxide film.

2. The semiconductor substrate according to claim 1, wherein a thickness of said doped polysilicon layer in its thickest part in said edge part is equal to or larger than a total thickness of said buried oxide film and said SOI layer, and said doped polysilicon layer is formed also on said second main surface.

3. A semiconductor substrate having one main surface, the other main surface on the opposite side, and a side part, wherein a part where an active region is formed in said one main surface is defined as a center part, and a part including a peripheral region around said center part in said one main surface and said side part is defined as an edge part, said semiconductor substrate comprising, a buried oxide film and an SOI layer formed in said one main surface in a sequentially stacked form, and a protective oxide film formed only in said edge part on the side of said one main surface of said semiconductor substrate, said protective oxide film engaging an edge surface of said SOI layer and being provided to be continuous with said buried oxide film.

4. The semiconductor substrate according to claim 1, wherein said SOI layer is not formed in said edge part.

5. The semiconductor substrate according to claim 3, wherein said SOI layer is not formed in said edge part.

* * * * *